(12) United States Patent
Nakazawa

(10) Patent No.: US 7,706,166 B2
(45) Date of Patent: Apr. 27, 2010

(54) SEMICONDUCTOR MEMORY DEVICE COMPRISING MEMORY ELEMENT PROGRAMMING CIRCUITS HAVING DIFFERENT PROGRAMMING THRESHOLD POWER SUPPLY VOLTAGES

(75) Inventor: Shigeyuki Nakazawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 142 days.

(21) Appl. No.: 11/790,200

(22) Filed: Apr. 24, 2007

(65) Prior Publication Data

US 2007/0253236 A1   Nov. 1, 2007

(30) Foreign Application Priority Data

Apr. 26, 2006 (JP) .............................. 2006-121962

(51) Int. Cl.
  *G11C 17/00* (2006.01)
(52) U.S. Cl. ................. 365/96; 365/225.7; 365/185.14; 365/185.28
(58) Field of Classification Search .................. 365/96, 365/225.7, 185.14, 185.28
  See application file for complete search history.

(56) References Cited

U.S. PATENT DOCUMENTS

| | | | |
|---|---|---|---|
| 6,144,247 A | 11/2000 | Kim et al. | |
| 6,633,506 B2 * | 10/2003 | Casper et al. | 365/225.7 |
| 6,690,597 B1 * | 2/2004 | Perlov et al. | 365/94 |
| 6,759,895 B2 * | 7/2004 | Takami | 327/525 |
| 6,944,058 B2 * | 9/2005 | Wong | 365/185.22 |
| 7,339,848 B1 * | 3/2008 | Stansell et al. | 365/225.7 |
| 7,345,939 B2 * | 3/2008 | Lee et al. | 365/208 |
| 2004/0240268 A1 * | 12/2004 | Kim et al. | 365/185.09 |
| 2006/0092703 A1 * | 5/2006 | Chae et al. | 365/185.18 |

FOREIGN PATENT DOCUMENTS

| | | |
|---|---|---|
| JP | 2-179264 | 7/1990 |
| JP | 2004-22736 | 1/2004 |
| JP | 2004-303354 | 10/2004 |
| JP | 3660828 | 2/2005 |

* cited by examiner

*Primary Examiner*—Hoai V Ho
*Assistant Examiner*—Anthan T Tran
(74) *Attorney, Agent, or Firm*—McGinn IP Law Group, PLLC

(57) ABSTRACT

A semiconductor memory device has first and second AF programming circuits having low and high AF programming threshold power supply voltages, respectively. In a process where a large majority of programming is carried out in the semiconductor memory device alone, the second AF programming circuit is used. In a module process where semiconductor devices having low withstand voltages are mounted in a module, the first AF programming circuit is used.

21 Claims, 8 Drawing Sheets

SEMICONDUCTOR MEMORY DEVICE COMPRISING MEMORY ELEMENT PROGRAMMING CIRCUITS HAVING DIFFERENT PROGRAMMING THRESHOLD POWER SUPPLY VOLTAGES

This application claims priority to application JP 2006-121962, the disclosure of which is incorporated herein by reference.

BACKGROUND OF THE INVENTION

This invention relates to a semiconductor memory device and, in particularly, to a semiconductor memory device including nonvolatile memory elements.

In resent year, a semiconductor memory device is made on a large scale every year. For example, in a Dynamic Random Access Memory (which is abbreviated as DRAM), a product having a memory capacity of 1 gigabits is developed and goes into actual use. In a large-capacity semiconductor memory device, it is difficult to perfectly exclude defects in some of memory cells during manufacturing the large-capacity semiconductor memory device. For this purpose, the large-capacity semiconductor memory device comprises redundancy circuits for replacing the defective memory cells by redundant memory cells to remedy the defective memory cells. More specifically, the redundancy circuits give relief to the defective memory cells by storing addresses for the defective memory cells in nonvolatile memory elements and by substituting the redundancy or spare memory cells for the defective memory cells. By giving relief to the defective memory cell by the redundancy circuits, yields of the large-capacity semiconductor memory device are improved and the costs thereof is cut down.

The nonvolatile memory elements comprise, for example, fuse elements which are fused a poly-silicon wires or metal wires by a laser beam or a large current, and anti-fuse elements which are applied with a high voltage higher than a critical voltage to be short-circuited. The anti-fuse elements are called AF elements. In recent times, the AF elements are adopted in many instances. This is because it is possible to write information in a process after assembling of a package, a consumed power is small so that the current for breaking down the dielectric film is considerable smaller than the current for fusing the wires, and so on. In the manner which is described above, the semiconductor memory device including the AF elements is commonly used.

The description will proceed to the anti-fuse element acting as the nonvolatile memory element. The anti-fuse element comprises a capacitance element where an insulating film sandwiched between both electrodes. By breaking-down the capacitance element, a write-in (a programming) of a memory data is carried out. The semiconductor memory device comprises a write-in circuit (a programming circuit) therein. The write-in circuit (the programming circuit) applies a high voltage between the both electrodes of the capacitance element to break down the insulating film of the capacitance element and thereby to short the both electrodes. By breaking down the insulating film of the capacitance element to make resistance of the capacitance element low, information is programmed in the memory element. Programming for the anti-fuse element enables after packaging of the semiconductor memory device and one of features of the anti-fuse element is that it is possible to write information in any process.

Therefore, the write-in circuit (the programming circuit) comprises a high voltage generating circuit for generating a high voltage which is adequate for braking down the capacitance element. As the high voltage generating circuit, a pumping circuit for pumping a supplied power supply voltage is used. The high voltage for breaking down the capacitance element is obtained by multiplying the power supply by a factor of several by the pumping circuit. In this event, as the power supply voltage, a voltage as high as possible is supplied in order to make stages of pumping few and to make the efficiency of the current improve. Therefore, as the power supply voltage, a maximum rated voltage value of an operation power supply voltage, an absolute maximum rated voltage value thereof, or a screening voltage value is used. The screening voltage is for detecting an initial defect and is higher than the absolute maximum rated voltage.

The uses of the anti-fuse elements are multifaceted. For example, the anti-fuse elements are used not only in a replacement of the defective addresses in the above-mentioned redundancy circuits but also timing adjustment to a delay circuit, control of an internal circuit, changing of word (bit, word) configuration in a memory device, or the like.

FIG. 9 shows a process flow related to programming of the anti-fuse elements in the semiconductor memory device. The process for programming the anti-fuse elements is carried out in a wafer test T1 in a wafer state and a packaging test T2 at evaluation and screening after assembling a product. In the wafer test T1, programming is largely carried out for anti-fuse elements for switching an internal operation. In addition, in the packaging test T2, programming is carried out for not only the anti-fuse elements for switching the internal operation but also anti-fuse elements for replacing defective addresses. A normal semiconductor memory device is shipped to a user after the packaging test T2 has completed.

However, in recent years, miniaturization of the semiconductor memory devices is required and semiconductor makers largely ship the semiconductor memory devices after assembling the semiconductor memory devices into a module or PoP (Package on Package). Under the circumstances, a module (PoP) test T3 after assembling the module or PoP is added as shown in a right hand of FIG. 9. Inasmuch as defects occur caused by addition of assembling the module or PoP, replacement of the defective addresses for the redundancy circuit from the defective memory cells is carried out.

However, the semiconductor devices mounted on the module are not always have the same withstand voltage for the power supply voltage. In other words, the semiconductor memory devices having low withstand voltages for the power supply voltage are mounted in the module although the semiconductor memory devices are enable to operate at the same power supply voltage. Under the circumstance, when the module is supplied with the power supply voltage used in a step-up circuit for destroying conventional anti-fuse elements, the semiconductor memory devices having the low withstand voltage for the power supply voltage might destroy. On the other hand, when the supplied power supply voltage is lowered, a desired high voltage cannot be obtained and it is impossible to program the anti-fuse elements because the anti-fuse elements cannot be destroyed. Accordingly, in the module where the semiconductor memory devices having the high withstand voltage for the power supply voltage and the semiconductor memory devices having the low withstand voltage for the power supply voltage are mixed and mounted thereon, the problem that the anti-fuse elements cannot be used are just beginning to come to the surface. Inasmuch as the redundancy circuits using the anti-fuse elements cannot be used, the conventional semiconductor memory device is disadvantageous in that yields of the module are reduced and the cost of the module is increased.

A prior art in relation to the anti-fuse elements is already known, for example, in a patent document 1 (Japanese Unexamined Patent Application Publication of Tokkai No. 2004-022,736 or JP-A 2002-22736 which corresponds to U.S. Pat. No. 6,759,895). The patent document 1 describes a data latch circuit having anti-fuse elements. The data latch circuit comprises a voltage selection block, first and second p-channel MOSFETs constituting a latching block, first and second n-channel MOSFETs for setting programming data, and third and fourth n-channel MOSFETs constituting capacitive anti-fuse elements to be programmed with a logic level "1" or "0". The third n-channel MOSFET is called a first anti-fuse element while the fourth n-channel MOSFET is called a second anti-fuse element. The logic level "1" to be stored in the data latch circuit effects dielectric breakdown of the gate insulation film of the second anti-fuse element, whereas logic level "0" effects dielectric breakdown of the gate insulation film of the first anti-fuse element. The voltage selection block is connected to a first power source providing a normal operating voltage and a second power source providing a programming voltage. The voltage selection block selects one of the normal operating voltage and programming voltage based on a pair of programming control signals, thereby delivering a selected voltage through a voltage selection node. The first and the second anti-fuse elements may comprise third and fourth p-channel MOSFETs having gates connected to the ground. The gates of the third and forth p-channel MOSFETs may be connected to a third power source having a negative potential instead of the ground. This configuration can reduce the programming voltage by a voltage corresponding to the negative potential.

In addition, a patent document 2 (Japanese Patent No. 3,660,828 which corresponds to U.S. Pat. No. 6,114,247) discloses an anti-fuse programming circuit using a variable voltage generator. The variable voltage generator includes a switching part for switching an output signal from the variable voltage generator to any one of a source voltage and a half voltage in response to a programming signal and complementary programming signal.

However, the above-mentioned prior art patent documents 1 and 2 neither describe nor understand a problem related to different withstand voltages of power supply voltage for the semiconductor devices in the module. Accordingly, inasmuch as the problem is not understood, the above-mentioned prior art patent documents 1 and 2 never teach technique for resolving the problem. Therefore, the above-mentioned prior patent documents 1 and 2 are disadvantageous in that it is impossible to use a redundancy circuit in the module.

SUMMARY OF THE INVENTION

It is an object of this invention to provide a semiconductor memory device which is capable of efficiently programming a nonvolatile memory element in a module where semiconductor devices having low withstand voltage for a power supply voltage are mounted in the module.

Other objects of this invention will become clear as the description proceeds.

According to an aspect of this invention, a semiconductor memory device comprises first through N-th memory element programming circuits comprising first through N-th nonvolatile memory elements, respectively, where N represents a positive integer which is not less than two. The first through the N-th memory element programming circuits comprise first through N-th programming voltage supplying portions for supplying first through N-th programming voltages to the first through the N-th nonvolatile memory elements, respectively. The first through the N-th memory element programming circuits have first through N-th memory element programming threshold power supply voltages, respectively, which are different from one another. Each of the first through the N-th nonvolatile memory elements may comprise an anti-fuse element.

DESCRIPTION OF THE PREFERRED EMBODIMENTS

Figure 1A:
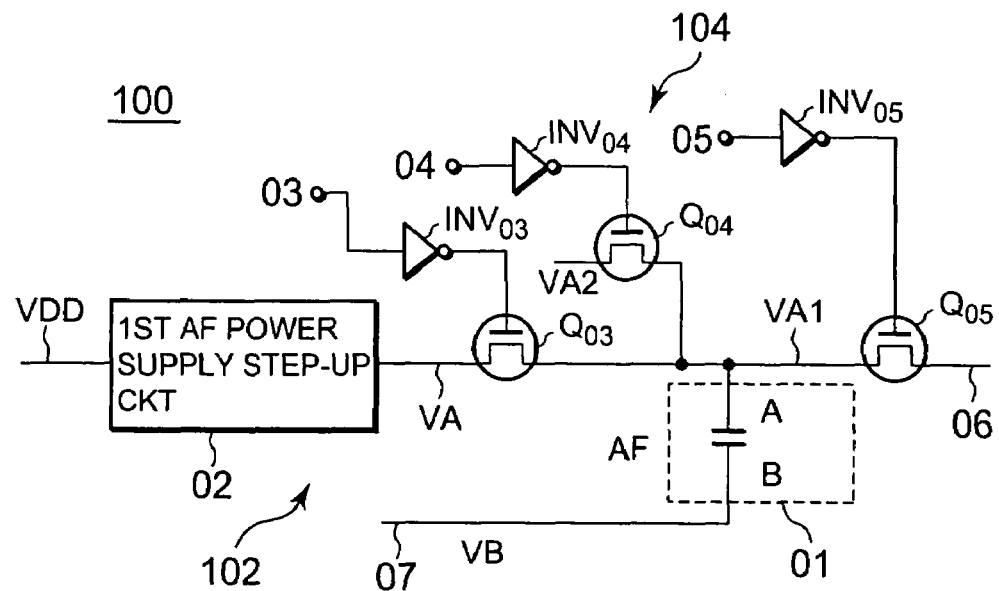
FIGS. 1A and 1B are circuit diagrams of first and second AF programming circuits for use in a semiconductor memory device according to a first embodiment of this invention.
Figure 1B:
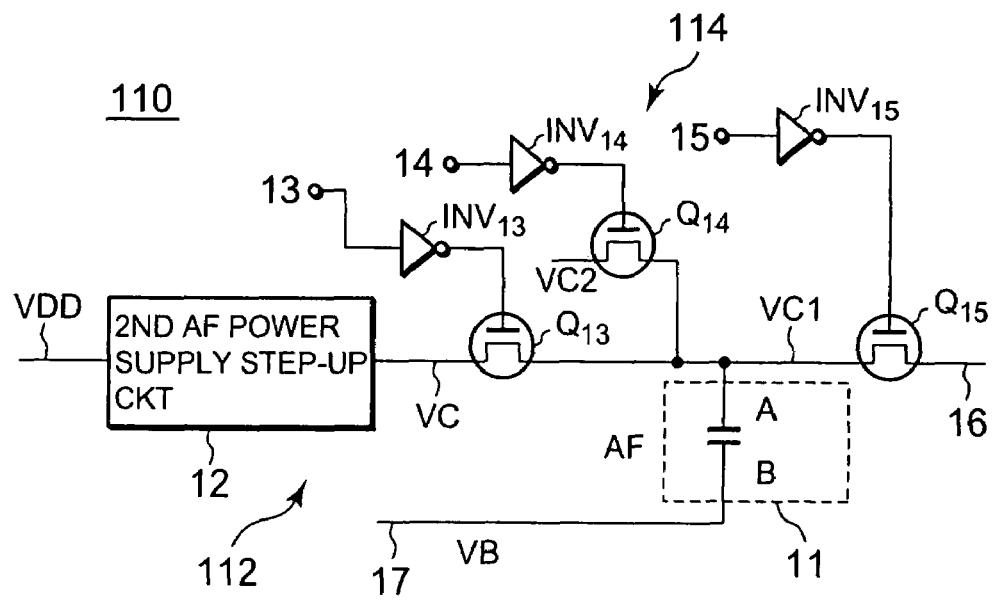

Referring to FIGS. 1A, 1B, 2, and 9, the description will proceed to semiconductor memory device having anti-fuse elements according to a first embodiment of this invention. FIGS. 1A and 1B show first and second AF programming circuits 100 and 110, respectively. The first and the second AF programming circuits 100 and 110 are called first and second memory element programming circuits, respectively.

The first AF programming circuit 100 illustrated in FIG. 1A is an AF programming circuit wherein a first step-up voltage VA is applied to a high potential electrode A and a predetermined voltage VB is applied to a low potential electrode B. A first programming voltage is generated using a low power supply voltage VDD which is available in a module test.

The second AF programming circuit 110 illustrated in FIG. 1B is an AF programming circuit wherein a second step-up voltage VC is applied to the high potential electrode A and the predetermined voltage VB is applied to the low potential electrode B. A second programming voltage is generated using a high power supply voltage VDD for the semiconductor memory device alone.

Figure 2:
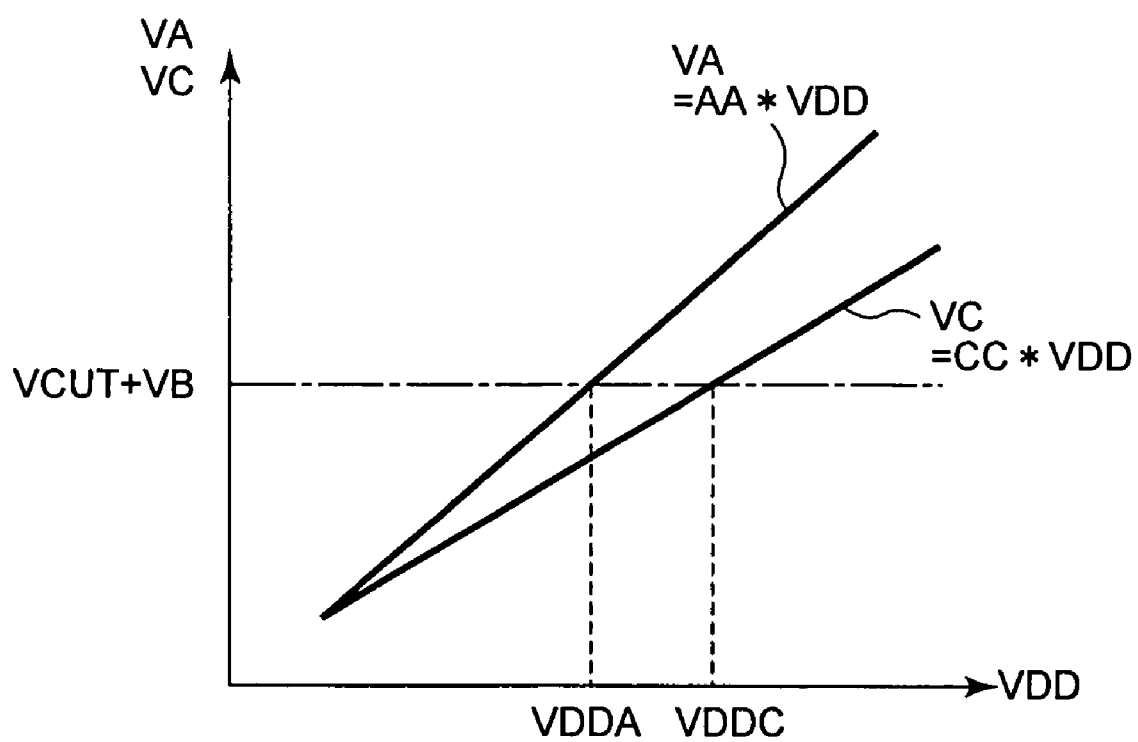
FIG. 2 is a view showing a relationship between a power supply voltage circuit and a step-up voltage in the first and the second AF programming circuits illustrated in FIGS. 1A and 1B.
Figure 9:
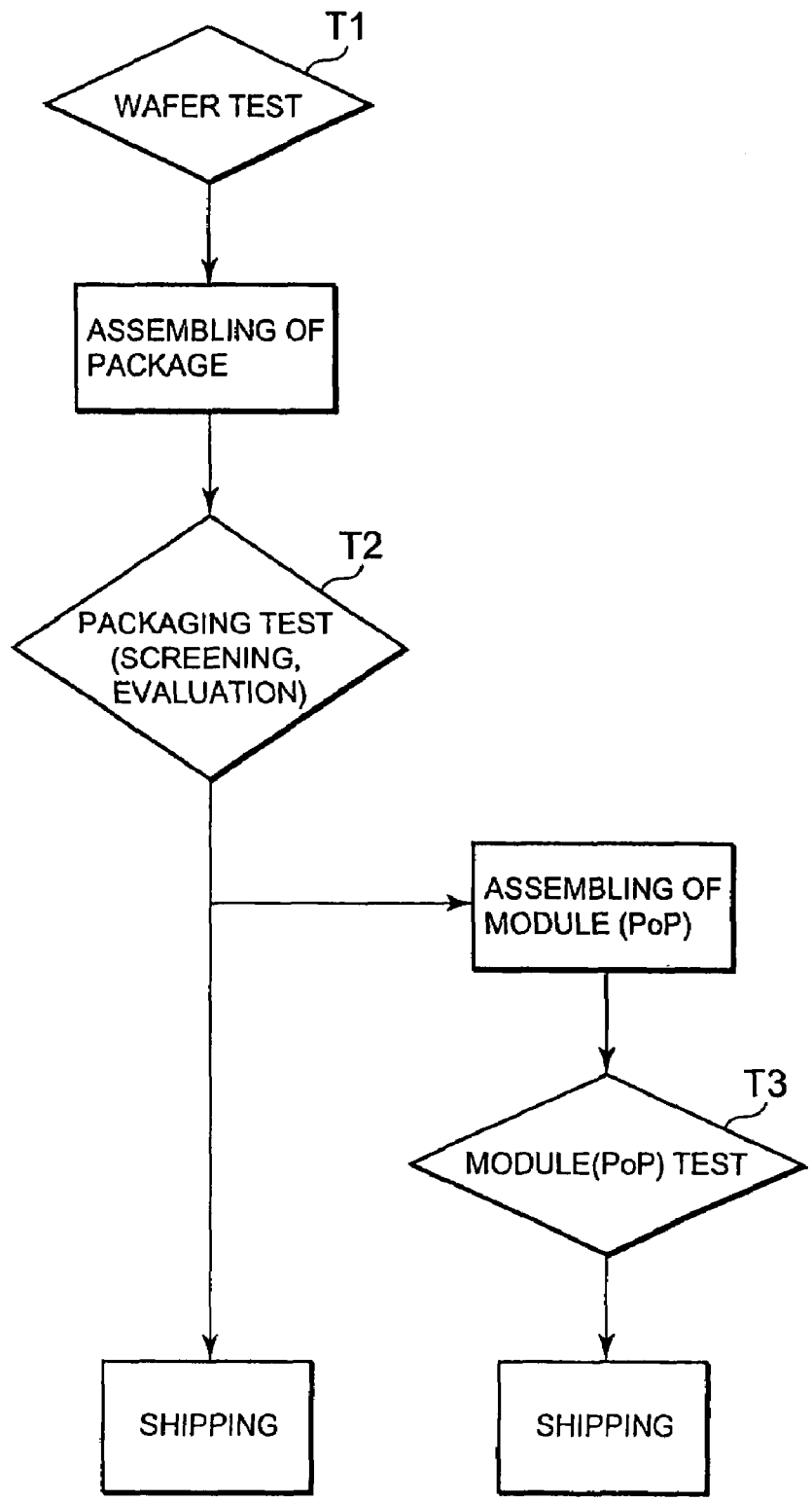
FIG. 9 is a view showing a process flow related to a programming for anti-fuse elements in a semiconductor memory device.

FIG. 2 is a view showing a relationship between the supplied power supply voltage VDD and the first and the second step-up voltages VA and VC in the first and the second AF programming circuits 100 and 100 illustrated in FIGS. 1A and 1B. FIG. 9 shows the process flow related to the programming of the anti-fuse elements in the semiconductor memory device.

In the semiconductor memory device according to this invention, as shown, for example, in FIG. 9, a wafer test T1 at a wafer state, a packaging test T2 at evaluation and screening after assembling a product, and a module (PoP) test T3 are carried out. In the wafer test T1, programming is carried out for a first kind of anti-fuse elements for switching an internal operation. In the packaging test T2, programming is carried out for not only the first kind of anti-fuse elements for switching the internal operation but also a second kind of anti-fuse elements for replacing defective addresses in a redundancy circuit. In the module test T3, programming is carried out for the second kind of anti-fuse elements for replacing defective addresses in the redundancy circuit. In this event, the module comprises not only the semiconductor memory device but also other electronic parts and semiconductor devices both of which have a withstand voltage lower than that of the semiconductor memory device.

Therefore, in the module test T3, the power supply voltage for the AF programming circuit for programming the anti-fuse elements is a power supply voltage which is lower than that in a normal test for the semiconductor memory device. The semiconductor memory device according to this invention comprises the first and the second AF programming circuits 100 and 110 each of which includes the anti-fuse element which is programmed by a programmable voltage VCUT.

The first AF programming circuit 100 is supplied with a low power supply voltage which is, for example, equal to an operation power supply voltage of the semiconductor memory device. The first AF programming circuit 100 is for programming the anti-fuse element by the first step-up voltage into which the low power supply voltage is stepped up. The first AF programming circuit 100 is used in the module test T3.

The second AF programming circuit 110 is supplied with a high power supply voltage which corresponds, for example, to an absolute maximum power supply rated voltage or a screening voltage higher than the operation power supply voltage of the semiconductor memory device. The second AF programming circuit 110 is for programming the anti-fuse element by the second step-up voltage into which the high power supply voltage is steppe up. The second AF programming circuit 110 is not used in the module test T3 but is used in a state of the semiconductor memory device alone such as the wafer test T1 and the packaging test T2.

Although the first and the second AF programming circuits 100 and 110 are used in different processes, the first AF programming circuit 100 is called a module AF programming circuit while the second AF programming circuit 110 is called a discrete AF programming circuit. In addition, it is assumed that the anti-fuse elements in themselves have the same characteristics and are destructively programmed by the same programmable voltage VCUT.

As shown in FIG. 1A, the first AF programming circuit 100 comprises a first anti-fuse (AF) element 01, a first programming voltage supplying portion 102 for supplying the first programming voltage, and a first control circuit 104 which will later be described. The first programming voltage supplying portion comprises a first AF power supply step-up circuit 02 and a first supply line 07 for supplying the predetermined voltage VB.

The first anti-fuse element 01 is an anti-fuse element having first and second electrodes A and B. The first electrode A of the first anti-fuse element 01 is supplied with a voltage VA1 while the second electrode B of the first anti-fuse element 01 is supplied with the predetermined voltage VB.

The first AF power supply step-up circuit 02 is a high voltage generating circuit for programming the first anti-fuse element 01. The first AF power supply step-up circuit 02 is a circuit for obtaining the first step-up voltage VA into which a generally supplied power supply voltage VDD is pumped and step-up. The ratio between the first step-up voltage and the power supply voltage VDD is called a first step-up coefficient AA (the first step-up voltage/the power supply voltage). The first step-up coefficient AA can be set by a circuit configuration such as step numbers of pumping. The first AF power supply step-up circuit 02 is supplied with the power supply voltage VDD and steps up the power supply voltage VDD to the first step-up voltage VA. The first step-up voltage VA is represented by:

$$VA = M*VDD.$$

The first control circuit 104 comprises first through third inverter circuits $INV_{03}$, $INV_{04}$, and $INV_{05}$ and first through third transistors $Q_{03}$, $Q_{04}$, and $Q_{05}$. The first control circuit 104 is supplied with a first programming selection signal 03, a first preset control signal 04, and a first decision signal 05. The first programming selection signal 03 is supplied to a control terminal of the first transistor $Q_{03}$ through the first inverter circuit $INV_{03}$. The first preset control signal 04 is supplied to a control terminal of the second transistor $Q_{04}$ through the second inverter circuit $INV_{04}$. The first decision signal 05 is supplied to a control terminal of the third transistor $Q_{05}$ through the third inverter circuit $INV_{05}$.

The first transistor Q03 has an input terminal supplied with the first step-up voltage VA and an output terminal connected to the first electrode A of the first anti-fuse element 01. The second transistor Q04 has an input terminal supplied with a first preset voltage VA1 and an output terminal connected to the first electrode A of the first fuse element 01. The third transistor Q05 has an input terminal connected to the first electrode A of the first anti-fuse element 01 and an output terminal connected to a first anti-fuse decision node 06.

The first programming selection signal 03 is a selection signal for destructively programming the first anti-fuse element 01. The first programming selection signal 03 is generated on the basis of a supplied power supply voltage value, a command, and an address. The first programming selection signal 03 is for selecting the first AF programming circuit 100 and the first anti-fuse element 01 provided therein. On programming, the first programming selection signal 03 becomes a logic "H" level. When the programming selection signal 03 becomes the logic "H" level, the first transistor Q03 is turned on to transfer the first step-up voltage VA generated by the first AF power supply step-up circuit 02 to the first electrode A of the first anti-fuse element 01 as the voltage VA1. The first preset control signal 04 is a control signal for presetting the first electrode A of the first anti-fuse element 01. On programming and on anti-fuse decision, the first preset control signal 04 becomes a logic "H" level in a one-shot fashion to preset the first electrode A of the first anti-fuse element 01 to the first preset voltage VA2. The first decision signal 05 is a decision control signal for transferring a potential state of the first electrode A of the first anti-fuse element to the first anti-fuse decision node 06. On anti-fuse decision, the first decision signal 05 becomes a logic "H" level. Otherwise, the first decision signal 05 takes a logic "L" level.

As shown in FIG. 1B, the second AF programming circuit 110 comprises a second anti-fuse (AF) element 11, a second programming voltage supplying portion 112 for supplying a second programmable voltage to the second anti-fuse element 11, and a second control circuit 114 which will later be described. The second programming voltage supplying portion 112 comprises a second AF power supply step-up circuit 12 and a second supply line 17 for supplying the predetermined voltage VB.

The second anti-fuse element 11 is an anti-fuse element having first and second electrodes A and B. The second anti-fuse element 11 is the anti-fuse element used in a process which is different from that of the first anti-fuse element 01. However, the first and the second anti-fuse elements 01 and 11 are similar in structure and have the same destructive programming characteristic. The first electrode A of the second anti-fuse element 11 is supplied with a voltage VC1 while the second electrode B of the second anti-fuse element 11 is supplied with the predetermined voltage VB.

The second AF power supply step-up circuit 12 is a high voltage generating circuit for programming the second anti-fuse element 11. The second AF power supply step-up circuit 12 is a circuit for obtaining the second step-up voltage VC into which the supplied power supply voltage VDD is pumped and step-up. The second AF power supply step-up circuit 12 has a second step-up coefficient CC. The second AF power supply step-up circuit 12 is supplied with the power supply voltage VDD and steps up the power supply voltage VDD to the second step-up voltage VC. The second step-up voltage VC is represented by:

$$VC = CC * VDD.$$

The second control circuit 114 comprises first through third inverter circuits $INV_{13}$, $INV_{14}$, and $INV_{15}$ and first through third transistors $Q_{13}$, $Q_{14}$, and $Q_{15}$. The second control circuit 114 is supplied with a second programming selection signal 13, a second preset control signal 14, and a second decision signal 15. The second programming selection signal 13 is supplied to a control terminal of the first transistor $Q_{13}$ through the first inverter circuit $INV_{13}$. The second preset control signal 14 is supplied to a control terminal of the second transistor $Q_{14}$ through the second inverter circuit $INV_{14}$. The second decision signal 15 is supplied to a control terminal of the third transistor $Q_{15}$ through the third inverter circuit $INV_{15}$.

The first transistor $Q_{13}$ has an input terminal supplied with the second step-up voltage VC and an output terminal connected to the first electrode A of the second anti-fuse element 11. The second transistor $Q_{14}$ has an input terminal supplied with a second preset voltage VC2 and an output terminal connected to the first electrode A of the second anti-fuse element 11. The third transistor $Q_{15}$ has an input terminal connected to the first electrode A of the second anti-fuse element 11 and an output terminal connected to a second anti-fuse decision node 16.

The second programming selection signal 13 is a selection signal for destructively programming the second anti-fuse element 11. The second programming selection signal 13 is generated on the basis of a supplied power supply voltage value, a command, and an address. The second programming selection signal 13 is for selecting the second programming circuit 110 and the second anti-fuse element 11 provided therein. On programming, the second programming selection signal 13 becomes a logic "H" level. When the second programming selection signal 13 becomes the logic "H" level, the first transistor $Q_{13}$ is turned on to transfer the second step-up voltage VC generated by the second AF power supply step-up circuit 12 to the first electrode A of the second anti-fuse element 11 as the voltage VC1. The second preset control signal 14 is a control signal for presetting the first electrode A of the second anti-fuse element 11. On programming and on anti-fuse decision, the second preset control signal 14 becomes a logic "H" level in a one-shot fashion to preset the first electrode A of the second anti-fuse element 11 to the second preset voltage VC2. The second decision signal 15 is a decision control signal for transferring a potential state of the first electrode A of the second anti-fuse element 11 to the second anti-fuse decision node 16. On anti-fuse decision, the second decision signal 15 becomes a logic "H" level. Otherwise, the second decision signal 15 takes a logic "L" level.

In the manner which is described above, the semiconductor memory device according to the first embodiment of this invention comprises the first and the second AF programming circuits 100 and 110. Each of the first and the second AF programming circuits 100 and 110 comprises one anti-fuse element and one control circuit therefor. However, each AF programming circuit may comprise a plurality of anti-fuse elements and a plurality of control circuits. Under the circumstances, each anti-fuse element has both electrodes which are connected to those in the similar manner which is described in conjunction with FIGS. 1A and 1B. That is, the same predetermined voltage VB is supplied to the second electrode B of each anti-fuse element and the anti-fuse elements have similar electrode connection in the first and the second AF programming circuits.

Referring to FIG. 1A, description will be made as regards operation of the first AF programming circuit 100.

It will be assumed that the first AF programming circuit 100 is put into a standby state. In this event, the first AF power supply step-up circuit 02 generates the first step-up voltage VA. In addition, all of the first programming selection signal 03, the first preset control signal 04, and the first decision signal 05 take the logic "L" level and all of the first through the third transistors $Q_{03}$, $Q_{04}$, and $Q_{05}$ are turned off. When the programming is carried out to the first anti-fuse element 01, the first preset control signal 04 is first changed to the logic "H" level in the one-shot fashion. Under the control, the voltage VA1 of the first electrode A of the first anti-fuse element 01 is preset into the first preset voltage VA2. Subsequently, the first programming selection signal 03 is put into the logic "H" level to select the first anti-fuse element 01 to be programmed.

Inasmuch as the first electrode A of the first anti-fuse element 01 is supplied with the first step-up voltage VA, the voltage VA1 of the first electrode A of the first anti-fuse element 01 becomes the first step-up voltage VA, namely, VA1=VA. In the first anti-fuse element 01, a voltage difference (VA−VB) occurs between the first electrode A and the second electrode B. If the voltage difference (VA−VB) is higher than the programmable voltage VCUT of the first anti-fuse element 01, the first anti-fuse element 01 is destroyed and programmed. Thereafter, the first programming selection signal 03 is turned back to the logic "L" level.

Next, decision operation of the first anti-fuse element 01 will be described. The first preset control signal 04 is first preset into the logic "H" level in the one-shot fashion. Under the control, the voltage VA1 of the first electrode A of the first anti-fuse element 01 is preset into the first preset voltage VA2, namely, VA1=VA2. Subsequently, the first decision signal 05 is changed to the logic "H" level to force the third transistor $Q_{05}$ into conduction and the potential state of the first electrode A of the first anti-fuse element 01 is read out to the first anti-fuse decision node 06. It will be assumed that the first anti-fuse element 01 is destructively programmed. In this event, the voltage of the first electrode A of the first anti-fuse element 01 is changed from the first preset voltage VA2 to the predetermined voltage VB of the second electrode B of the first anti-fuse element 01. It will be assumed that the first anti-fuse element 01 is not destructively programmed. In this event, the voltage of the first electrode A of the first anti-fuse element 01 holds the first preset voltage VA2. After the decision has completed, the first decision signal 05 is turned back to the logic "L" level.

Referring to FIG. 1B, description will be made as regards operation of the second AF programming circuits 110.

It will be assumed that the second AF programming circuit 110 is put into a standby state. In this event, the second AF power supply step-up circuit 12 generates the second step-up voltage VC. In addition, all of the second programming selection signal 13, the second preset control signal 14, and the second decision signal 15 take the logic "L" level and all of the first through the third transistors $Q_{13}$, $Q_{14}$, and $Q_{15}$ are turned off. When the programming is carried out to the second anti-fuse element 11, the second preset control signal 14 is changed to the logic "H" level in the one-shot fashion. Under the control, the voltage VC1 of the first electrode A of the second anti-fuse element 11 is preset into the second preset voltage VC2. Subsequently, the second programming selection signal 13 is put into the logic "H" level to select the second anti-fuse element 11 to be programmed.

Inasmuch as the first electrodes A of the second anti-fuse element 11 is supplied with the second step-up voltage VC, the voltage VC1 of the first electrode A of the second anti-fuse element 11 becomes the second step-up voltage VC, namely, VC1=VC. In the second anti-fuse element 11, a voltage difference (VC−VB) occurs between the first electrode A and the second electrode B. If the voltage difference (VC−VB) is higher than the programmable voltage VCUT of the second anti-fuse element 11, the second anti-fuse element 11 is destroyed and programmed. Thereafter, the second programming selection signal 13 is turned back to the logic "L" level.

Next, decision operation of the second anti-fuse element 11 will be described. The second preset control signal 14 is first preset into the logic "H" level in the one-shot fashion. Under the control, the voltage VC1 of the first electrode A of the second anti-fuse element 11 is preset into the second preset voltage VC2, namely, VC1=VC2. Subsequently, the second decision signal 15 is changed to the logic "H" level to force the third transistor $Q_{15}$ into conduction and the potential state of the first electrode A of the second anti-fuse element 11 is read out to the second anti-fuse decision node 16. It will be assumed that the second anti-fuse element 11 is destructively programmed. In this event, the voltage of the first electrode A of the second anti-fuse element 11 is changed from the second preset voltage VA2 to the predetermined voltage VB of the second electrode B of the second anti-fuse element 11. It will be assumed that the second anti-fuse element 11 is not destructively programmed. In this event, the voltage of the first electrode A of the second anti-fuse element 11 holds the second preset voltage VC2. After the decision has completed, the second decision signal 15 is turned back to the logic "L" level.

FIG. 2 is a view showing dependence of each voltage used in description of FIGS. 1A and 1B related to the power supply voltage VDD. In VDD dependence of the first and the second step-up voltages VA and VB, the first and the second AF power supply step-up circuits 02 and 12 have the first and the second step-up coefficients AA and CC, respectively, in the manner which is described above. It will be assumed that first and second power supply voltages supplied to the first and the second AF power supply step-up circuits 02 and 12 are equal to VDDA and VDDC, respectively. In this event, the first and the second step-up voltages VA and VC are represented by:

$VA = AA*VDDA$, and $VC = CC*VDDC$, where the first power supply voltage VDDA is lower than the second power supply voltage VDDC, namely, VDDA<VDDC and the first step-up coefficient AA is larger than the second step-up coefficient CC, namely, AA>CC. A graph of the first step-up voltage VA has a slope which is larger than that of a graph of the second step-up voltage VC as shown in FIG. 2. That is, the first AF power supply step-up circuit 02 can step up the first power supply voltage VDDA to the voltage required to destructively program the first anti-fuse element 01. The second AF power supply step-up circuit 12 can step up the second power supply voltage VDDC higher than the first power supply voltage VDDA to the voltage required to destructively program the second anti-fuse element 11.

It will be assumed that the programmable voltage for programming the anti-fuse element is represented by VCUT and the second electrode B of the anti-fuse element is supplied with the predetermined voltage VB. In this event, the first electrode A of the anti-fuse element requires the voltage which is higher than (VCUT+VB). When the first power supply voltage is equal to VDDA, the first step-up voltage VA of the first AF power supply step-up circuit 02 is higher than the voltage (VCUT+VB). When the second power supply voltage is equal to VDDC, the second step-up voltage VC of the second AF power supply step-up circuit 12 is higher than the voltage (VCUT+VB). In other words, the first and the second anti-fuse elements 01 and 11 have different external voltages required to destroy the anti-fuse element. Hereinafter, such an external voltage will be called an anti-fuse programming threshold power supply voltage. Accordingly, the first AF programming circuit 100 has a first anti-fuse programming threshold power supply voltage of VDDA while the second AF programming circuit 110 has a second anti-fuse programming threshold power supply voltage of VDDC.

It will be assumed that the external voltage (the power supply voltage) VDD is represented by VDDE, and the first and the second programming selection signals 03 and 13 erroneously become the logic "H" level to select the first and the second AF programming circuits 100 and 110, where the external voltage VDDE satisfies an equation as follows:

VDDA<VDDE<VDDC.

Inasmuch as the first step-up voltage VA of the first AF programming circuit 100 is higher than the voltage (VCUT+VB), the first anti-fuse element 01 is destroyed. On the other hand, inasmuch as the second step-up voltage VC of the second AF programming circuit 110 is lower than the voltage (VCUT+VB), the second anti-fuse element 11 is not destroyed.

In the manner described above, when the supplied power supply voltage VDDE is higher than the first anti-fuse programming threshold power supply voltage VDDA and is lower than the second anti-fuse programming threshold power supply voltage of VDDC, namely, VDDA<VDDE<VDDC, the first AF programming circuit 100 can destructively program the first anti-fuse element 01 while the second AF programming circuit 110 cannot destructively program the second anti-fuse element 11.

It is preferable that the predetermined voltage VB applied to the second electrode B of the anti-fuse element is a negative voltage because it makes a voltage difference between both electrodes of the anti-fuse element high. The predetermined voltage VB may be a positive voltage. In addition, the first and the second preset voltages VA2 and VC2 may have the same voltage level. Furthermore, the voltages VA1 and VC1 of the preset level applied to the first electrode A of the anti-fuse element is a voltage which is lower than the voltage required to destructively program the anti-fuse element, and therefore the voltages VA1 and VC1 cannot destructively program the anti-fuse element.

The semiconductor memory device according to the first embodiment of this invention comprises the first and the second AF programming circuits 100 and 110. In the same semiconductor memory device, the first and the second AF programming circuits 100 and 110 have the first and the second anti-fuse programming threshold power supply voltages VDDA and VDDC, respectively, which are different from each other. That is, the first anti-fuse programming threshold power supply voltage VDDA is lower than the second anti-fuse programming threshold power supply voltage VDDC as shown in FIG. 2. The first AF programming circuit 100 having the first anti-fuse programming threshold power supply voltage VDDA is used in a test process having a low withstand upper limit voltage for the power supply voltage (e.g. the module test T3 of FIG. 9). On the other hand, the second AF programming circuit 110 having the second anti-fuse programming threshold power supply voltage VDDC is used in the wafer test T1 or the packaging test T2 in a state of the semiconductor memory device alone.

Inasmuch as the second AF programming circuit 110 having the second anti-fuse programming threshold power supply voltage VDDC has the second step-up coefficient CC which is small, the second AF power supply step-up circuit 12 has a high current efficiency. Therefore, the second AF programming circuit 110 carries out programming of the second anti-fuse element 11 with a high-efficiency. Although anti-fuse elements in the semiconductor memory device are used, for example, in the redundancy circuit, a large majority of the anti-fuse elements are programmed and replaced in the wafer test T1 or the packaging test T2. Accordingly, it is possible to carry out the programming on the large majority of the anti-fuse elements with the high-efficiency.

On the other hand, inasmuch as the first AF programming circuit 100 having the first anti-fuse programming threshold power supply voltage VDDA has the first step-up coefficient AA which is large, the first AF power supply step-up circuit 02 has a low current efficiency. However, the semiconductor memory device comprises the redundancy circuit which is already replaced in the wafer test T1 and the packaging test T2. Accordingly, defective memory cells occurring in the module test T3 are few in number. It will be assumed that the module comprises nine semiconductor memory devices. Under the circumstances, the module is defective although only one memory cell is defective in one of the nine semiconductor memory devices. Accordingly, redundancy circuits for giving relief to defective parts may be few in number. As a result, inasmuch as the redundancy circuits in the module test T3 are few in number, it is not necessary to take into account a programming efficiency and it is important that it is possible to program the anti-fuse elements with reliability.

In the first embodiment of this invention, the semiconductor memory device comprises a plurality of AF programming circuits wherein programmable voltages are obtained by different power supply voltages. According to the first embodiment of this invention, it is provided with the semiconductor memory device having the anti-fuse elements with a high programmable efficiency, a high relief efficiency, and which is capable to replacing defective addresses in the module test.

If the semiconductor memory device comprises only one AF programming circuit which has a programmable-voltage obtained by a low power supply voltage, the semiconductor memory device is disadvantageous in that the step-up coefficient is large and the current efficiency and the replacement efficiency are reduced. If the semiconductor memory device comprises only one AF programming circuit which has a programmable voltage obtained by a high power supply voltage, other semiconductor devices mounted on the module may be destroyed. It is therefore impossible to replace the defective addresses in the module test T3. The problems arises in a case where the semiconductor memory device comprises only one AF programming circuit. According to the first embodiment of this invention, the problems are resolved because the semiconductor memory device comprises a plurality of AF programming circuits.

According to the first embodiment of this invention, the semiconductor memory device comprises a plurality of AF programming circuits having different anti-fuse programming threshold power supply voltages. In a process where a large majority of programming are performed in the semiconductor memory device alone, the AF programming circuit having a high different anti-fuse programming threshold power supply voltage is used because efficiency is a high priority. On the other hand, in a process (e.g. the module test T3 of FIG. 9) after other semiconductor devices having low withstand voltages for the power supply voltage are mounted, the AF programming circuit having a low different anti-fuse programming threshold power supply voltage is used. Inasmuch as the semiconductor memory device comprises a plurality of AF programming circuits having different anti-fuse programming threshold power supply voltages, it is possible to obtain the semiconductor memory device having anti-fuse elements with a high programming efficiency and a high relief efficiency.

Figure 3A:
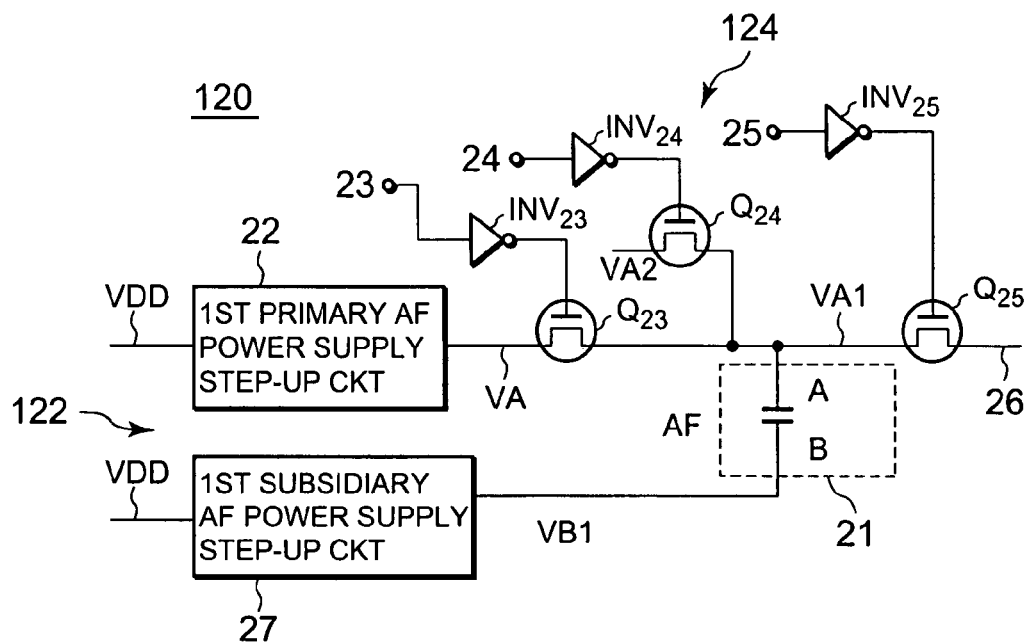
FIGS. 3A and 3B are circuit diagrams of first and second AF programming circuits for use in a semiconductor memory device according to a second embodiment of this invention.
Figure 3B:
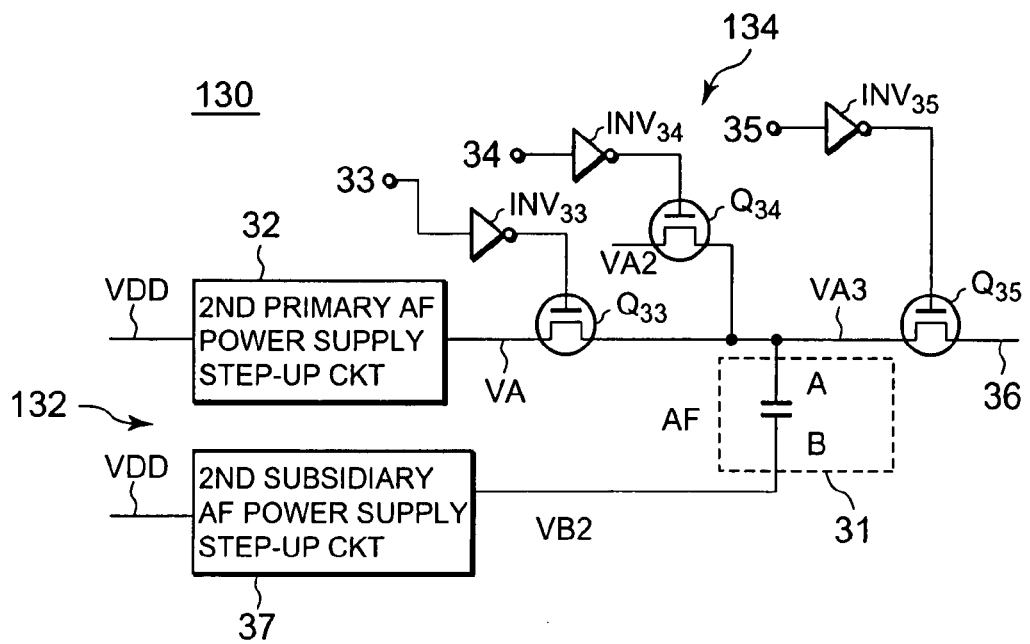
Figure 4:
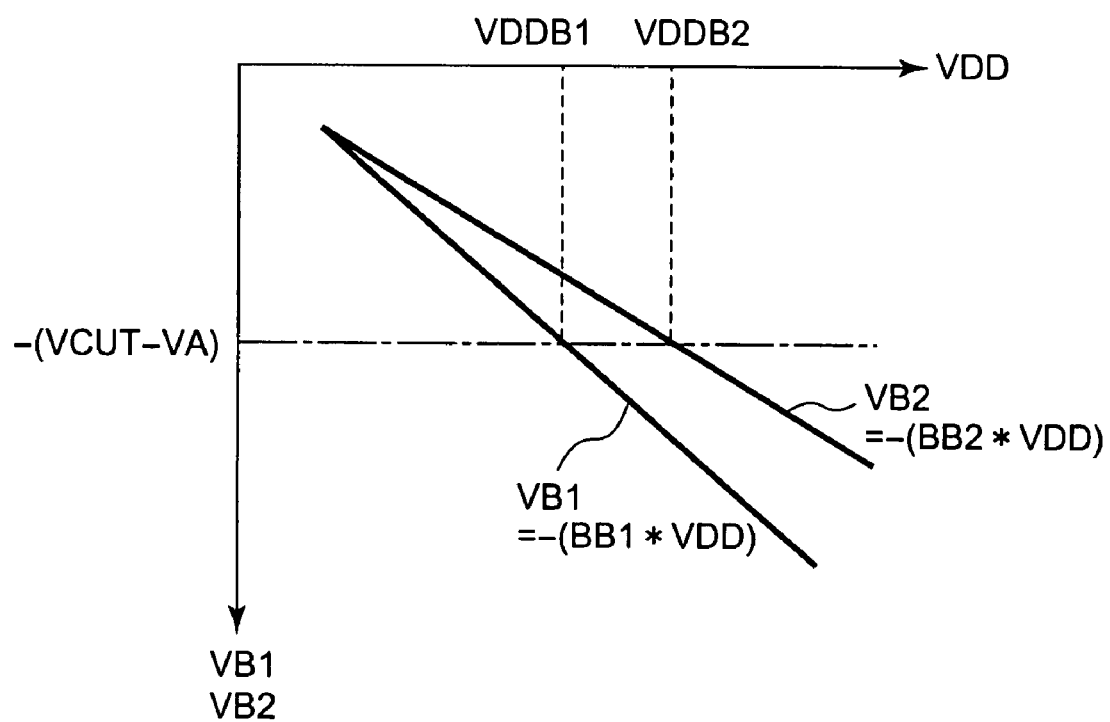
FIG. 4 is a view showing a relationship between a power supply voltage circuit and a step-up voltage in the first and the second AF programming circuits illustrated in FIGS. 3A and 3B.

Referring to FIGS. 3A, 3B, and 4, the description will proceed to semiconductor memory device having anti-fuse elements according to a second embodiment of this invention. The illustrated semiconductor memory device is an example where step-up circuits are applied to the second electrode B of the anti-fuse elements. Although the second electrode B of the anti-fuse elements are supplied with the constant voltage VB in the first embodiment of this invention, the second electrode B of the anti-fuse elements are supplied with different step-up voltages VB1 and VB2 in the second embodiment of this invention.

FIGS. 3A and 3B show first and second AF programming circuits 120 and 130, respectively. The first AF programming circuit 120 illustrated in FIG. 3A is an AF programming circuit wherein a primary step-up voltage VA is applied to a high potential electrode A and a first subsidiary step-up voltage depicted at VB1 is applied to a low potential electrode B. The first AF programming circuit 120 is available in the module test T3 of FIG. 9. The second AF programming circuit 130 illustrated in FIG. 3B is an AF programming circuit wherein the primary step-up voltage VA is applied to the high potential electrode A and a second subsidiary step-up voltage depicted at VB2 is applied to the low potential electrode B. The second AF programming circuit 130 is available for the semiconductor memory device alone. FIG. 4 is a view showing a relationship between the supplied power supply voltage VDD and the first and the second subsidiary step-up voltages VB1 and VB2 in the first and the second AF programming circuits 120 and 130 illustrated in FIGS. 3A and 3B.

As shown in FIG. 3A, the first AF programming circuit 120 comprises a first anti-fuse (AF) element 21, a first programming voltage supplying portion 122 for supplying a first programming voltage, and a first control circuit 124 which will later be described. The first programming voltage supplying portion comprises a first primary AF power supply step-up circuit 22 and a first subsidiary AF power supply step-up circuit 27.

The first anti-fuse element 21 is an anti-fuse element having first and second electrodes A and B. The first electrode A is called the high potential electrode which the second electrode B is called the low potential electrode. The first electrode A of the first anti-fuse element 21 is supplied with a voltage VA1 while the second electrode B of the first anti-fuse element 21 is supplied with the first subsidiary step-up voltage VB1 from the first subsidiary AF power supply step-up circuit 27.

The first primary AF power supply step-up circuit 22 is a high voltage generating circuit for generating a high voltage or a primary step-up voltage VA for programming the first anti-fuse element 21. The first primary AF power supply step-up circuit 22 is a step-up circuit where a first primary step-up coefficient AA is arbitrarily determined in the manner which is similar to that of the first AF power supply step-up circuit 02 illustrated in FIG. 1A. That is, the first primary AF power supply step-up circuit 22 is the step-up circuit for stepping up the external voltage (the power supply voltage) VDD to the primary step-up voltage VA which is represented by:

$$VA=AA*VDD.$$

The first subsidiary AF power supply step-up circuit 27 is a circuit for generating a negative voltage or a first subsidiary step-up voltage VB1 for programming the first anti-fuse element 21. The first subsidiary AF power supply step-up circuit 27 is a step-up circuit having a first subsidiary step-up coefficient BB1. That is, the first subsidiary AF power supply step-up circuit 27 is the step-up circuit for stepping up the external voltage (the power supply voltage) VDD to the first subsidiary step-up voltage VB1 which is represented by:

$$VB1=-(BB1*VDD).$$

The first control circuit 124 comprises first through third inverter circuits $INV_{23}$, $INV_{24}$, and $FNV_{25}$ and first through third transistors $Q_{23}$, $Q_{24}$, and $Q_{25}$. The first control circuit 124 is supplied with a first programming selection signal 23, a first preset control signal 24, and a first decision signal 25. The first programming selection signal 23 is supplied to a control terminal of the first transistor $Q_{23}$ through the first inverter circuit $INV_{23}$. The first preset control signal 24 is supplied to a control terminal of the second transistor $Q_{24}$ through the second inverter circuit $INV_{24}$. The first decision signal 25 is supplied to a control terminal of the third transistor $Q_{25}$ through the third inverter circuit $INV_{25}$.

The first transistor $Q_{23}$ has an input terminal supplied with the primary step-up voltage VA and an output terminal connected to the first electrode A of the first anti-fuse element 21. The second transistor $Q_{24}$ has an input terminal supplied with a preset voltage VA2 and an output terminal connected to the first electrode A of the first fuse element 21. The third transistor $Q_{25}$ has an input terminal connected to the first electrode A of the second anti-fuse element 21 and an output terminal connected to a first anti-fuse decision node 26.

The first programming selection signal 23 is a selection signal for destructively programming the first anti-fuse element 21. The first programming selection signal 23 is generated on the basis of a supplied power supply voltage value, a command, and an address. The first programming selection signal 23 is for selecting the first programming circuit 120 and the first anti-fuse element 21 provided therein. On programming, the first programming selection signal 23 becomes a logic "H" level. When the programming selection signal 23 becomes the logic "H" level, the first transistor $Q_{23}$ is turned on to transfer the primary step-up voltage VA generated by the first primary AF power supply step-up circuit 22 to the first electrode A of the first anti-fuse element 21 as the voltage VA1. The first preset control signal 24 is a control signal for presetting the first electrode A of the first anti-fuse element 21. On programming and on anti-fuse decision, the first preset control signal 24 becomes a logic "H" level in a one-shot fashion to transfer the preset voltage VA2 to the first electrode A of the first anti-fuse element 21 as the voltage VA1. The first decision signal 25 is a decision control signal for transferring a potential state of the first electrode A of the first anti-fuse element 21 to the first anti-fuse decision node 26. On anti-fuse decision, the first decision signal 25 becomes a logic "H" level. Otherwise, the first decision signal 25 takes a logic "L" level.

As shown in FIG. 3B, the second AF programming circuit 130 comprises a second anti-fuse (AF) element 31, a second programming voltage supplying portion 132 for supply a second programming voltage to the second anti-fuse element 31, and a second control circuit 134 which will later be described. The second programming voltage supplying portion 132 comprises a second primary AF power supply step-up circuit 32 and a second subsidiary AF power supply step-up circuit 37.

The second anti-fuse element 31 is an anti-fuse element having first and second electrodes A and B. The second anti-fuse element 31 is the anti-fuse element used in a process which is different from that of the first anti-fuse element 21. However, the first and the second anti-fuse elements 21 and 31 are similar in structure and have the same destructive programming characteristic. The first electrode A of the second anti-fuse element 31 is supplied with a voltage VC1 while the second electrode B of the second anti-fuse element 31 is supplied with a second subsidiary step-up voltage VB2 generated by the second subsidiary AF power supply step-up circuit 37.

The second primary AF power supply step-up circuit 32 is a high voltage generating circuit for generating a high voltage or the primary step-up voltage VA for programming the second anti-fuse element 31. The second primary AF power supply step-up circuit 32 is a step-up circuit where the primary step-up coefficient AA is arbitrarily determined in the manner which is similar to that of the first AF power supply step-up circuit 02 illustrated in FIG. 1A. That is, the second primary AF power supply step-up circuit 32 is the step-up circuit for stepping up the external voltage (the power supply voltage) VDD to the primary step-up voltage VA which is represented by:

$$VA=AA*VDD.$$

The second subsidiary AF power supply step-up circuit 37 is a circuit for generating a negative voltage or a second subsidiary step-up voltage VB2 for programming the second anti-fuse element 31. The second subsidiary AF power supply step-up circuit 37 is a step-up circuit having a second subsidiary step-up coefficient BB2. That is, the second subsidiary AF power supply step-up circuit 37 is the step-up circuit for stepping up the external voltage (the power supply voltage) VDD to the second subsidiary step-up voltage VB2 which is represented by:

$$VB2=-(BB2*VDD),$$

where the second subsidiary step-up coefficient BB2 is smaller than the first subsidiary step-up coefficient BB1, namely, BB1>BB2.

The second control circuit 134 comprises first through third inverter circuits $INV_{33}$, $INV_{34}$, and $INV_{35}$ and first through third transistors $Q_{33}$, $Q_{34}$, and $Q_{35}$. The second control circuit 134 is supplied with a second programming selection signal 33, a second preset control signal 34, and a second decision signal 35. The first programming selection signal 33 is supplied to a control terminal of the first transistor $Q_{33}$ through the first inverter circuit $INV_{33}$. The second preset control signal 34 is supplied to a control terminal of the second transistor $Q_{34}$ through the second inverter circuit $INV_{34}$. The second decision signal 35 is supplied to a control terminal of the third transistor $Q_{35}$ through the third inverter circuit $INV_{35}$.

The first transistor $Q_{33}$ has an input terminal supplied with the primary step-up voltage VA and an output terminal connected to the first electrode A of the second anti-fuse element 31. The second transistor $Q_{34}$ has an input terminal supplied with the preset voltage VA2 and an output terminal connected to the first electrode A of the second anti-fuse element 31. The third transistor $Q_{35}$ has an input terminal connected to the first electrode A of the first anti-fuse element 31 and an output terminal connected to a second anti-fuse decision node 36.

The second programming selection signal 33 is a selection signal for destructively programming the second anti-fuse element 31. The second programming selection signal 33 is generated on the basis of a supplied power supply voltage value, a command, and an address. The second programming selection signal 33 is for selecting the second programming circuit 130 and the second anti-fuse element 31 provided therein. On programming, the second programming selection signal 33 becomes a logic "H" level. When the second programming selection signal 33 becomes the logic "H" level, the first transistor $Q_{33}$ is turned on to transfer the primary step-up voltage VA generated by the second primary AF power supply step-up circuit 32 to the first electrode A of the second anti-fuse element 31 as the voltage VA3. The second preset control signal 34 is a control signal for presetting the first electrode A of the second anti-fuse element 31. On programming and on anti-fuse decision, the second preset control signal 34 becomes a logic "H" level in a one-shot fashion to transfer the preset voltage VA2 to the first electrode A of the second anti-fuse element 31 as the voltage VA3. The second decision signal 35 is a decision control signal for transferring a potential state of the first electrode A of the second anti-fuse element 31 to the second anti-fuse decision node 36. On anti-fuse decision, the second decision signal 35 becomes a logic "H" level. Otherwise, the second decision signal 35 takes a logic "L" level.

In the manner which is described above, the semiconductor memory device according to the second embodiment of this invention comprises the first and the second AF programming circuits 120 and 130. Each of the first and the second AF programming circuits 120 and 130 comprises one anti-fuse element and one control circuit therefor. However, each AF programming circuit may comprise a plurality of anti-fuse elements and a plurality of control circuits. Under the circumstances, each anti-fuse element has both electrodes which are connected to those in the similar manner which is described in conjunction with FIGS. 3A and 3B.

Referring to FIG. 3A, description will be made as regards operation of the first AF programming circuit 120.

It will be assumed that the first AF programming circuit 120 is put into a standby state. In this event, the first primary AF power supply step-up circuit 22 generates the primary step-up voltage VA. In addition, all of the first programming selection signal 23, the first preset control signal 24, and the first decision signal 25 take the logic "L" level and all of the first through the third transistors $Q_{23}$, $Q_{24}$, and $Q_{25}$ are turned off. When the programming is carried out to the first anti-fuse elements 21, the first preset control signal 24 is first changed to the logic "H" level in the one-shot fashion. Under the control, the voltage VA1 of the first electrode A of the first anti-fuse element 21 is preset into the preset voltage VA2. Subsequently, the first programming selection signal 23 is put into the logic "H" level to select the first anti-fuse element 21 to be programmed.

Inasmuch as the first electrode A of the first anti-fuse element 21 is supplied with the primary step-up voltage VA, the voltage VA1 of the first electrode A of the first anti-fuse element 21 becomes the primary step-up voltage VA, namely, VA1=VA. In the first anti-fuse element 21, a voltage difference (VA−VB1) occurs between the first electrode A and the second electrode B. If the voltage difference (VA−VB1) is higher than the programmable voltage VCUT of the first anti-fuse element 21, the first anti-fuse element 21 is destroyed and programmed. Thereafter, the first programming selection signal 23 is turned back to the logic "L" level.

Next, decision operation of the first anti-fuse element 21 will be described. The first preset control signal 24 is first preset into the logic "H" level in the one-shot fashion. Under the control, the voltage VA1 of the first electrode A of the first anti-fuse element 21 is preset into the preset voltage VA2, namely, VA1=VA2. Subsequently, the first decision signal 25 is changed to the logic "H" level to force the third transistor Q.sub.25 into conduction and the potential state of the first electrode A of the first anti-fuse element 21 is read out to the first anti-fuse decision node 26. It will be assumed that the first anti-fuse element 21 is destructively programmed. In this event, the voltage of the first electrode A of the first anti-fuse element 21 is changed from the preset voltage VA2 to the first subsidiary step-up voltage VB1 of the second electrode B of the first anti-fuse element 21. It will be assumed that the first anti-fuse element 21 is not destructively programmed. In this event, the voltage of the first electrode A of the first anti-fuse element 21 holds the preset voltage VA2. After the decision has completed, the first decision signal 25 is turned back to the logic "L" level.

Referring to FIG. 3B, description will be made as regards operation of the second AF programming circuits 130.

It will be assumed that the second AF programming circuit 130 is put into a standby state. In this event, the second primary AF power supply step-up circuit 32 generates the primary step-up voltage VA. In addition, all of the second programming selection signal 33, the second preset control signal 34, and the second decision signal 35 take the logic "L" level and all of the first through the third transistors $Q_{33}$, $Q_{34}$, and $Q_{35}$ are turned off. When the programming is carried out to the second anti-fuse element 31, the second preset control signal 34 is changed to the logic "H" level in the one-shot fashion. Under the control, the voltage VA3 of the first electrode A of the second anti-fuse element 31 is preset into the preset voltage VA2. Subsequently, the second programming selection signal 33 is put into the logic "H" level to select the second anti-fuse element 31 to be programmed.

Inasmuch as the first electrodes A of the second anti-fuse element 31 is supplied with the primary step-up voltage VA, the voltage VA3 of the first electrode A of the second anti-fuse element 31 becomes the primary step-up voltage VA, namely VA3=VA. In the second anti-fuse element 31, a voltage difference (VA−VB2) occurs between the first electrode A and the second electrode B. If the voltage difference (VA−VB2) is higher than the programmable voltage VCUT of the second anti-fuse element 31, the second anti-fuse element 31 is destroyed and programmed. Thereafter, the second programming selection signal 33 is turned back to the logic "L" level.

Next, decision operation of the second anti-fuse element 31 will be described. The second preset control signal 34 is first preset into the logic "H" level in the one-shot fashion. Under the control, the voltage VA3 of the first electrode A of the second anti-fuse element 31 is preset into the preset voltage VA2, namely, VA3=VA2. Subsequently, the second decision signal 35 is changed to the logic "H" level to force the third transistor $Q_{35}$ into conduction and the potential state of the first electrode A of the second anti-fuse element 31 is read out to the second anti-fuse decision node 36. It will be assumed that the second anti-fuse element 31 is destructively programmed. In this event, the voltage of the first electrode A of the second anti-fuse element 31 is changed from the preset voltage VA2 to the second subsidiary step-up voltage VB2 of the second electrode B of the second anti-fuse element 31. It will be assumed that the second anti-fuse element 31 is not destructively programmed. In this event, the voltage of the first electrode A of the second anti-fuse element 31 holds the preset voltage VA2. After the decision has completed, the second decision signal 35 is turned back to the logic "L" level.

FIG. 4 is a view showing dependence of each voltage used in description of FIGS. 3A and 3B related to the power supply voltage VDD. In VDD dependence of the first and the second subsidiary step-up voltages VB1 and VB2, the first and the second subsidiary AF power supply step-up circuits 27 and 37 have the first and the second subsidiary step-up coefficients BB1 and BB2, respectively, in the manner which is described above. The first subsidiary step-up coefficient BB1 is larger than the second subsidiary step-up coefficient BB2, namely, BB1>BB2. A graph of the first subsidiary step-up voltage VB1 has a slope which is larger than that of a graph of the second subsidiary step-up voltage VB2 shown in FIG. 4.

It will be assumed that the programmable voltage (the voltage difference between the first and the second electrodes A and B) for programming the anti-fuse element is represented by VCUT. The first and the second anti-fuse elements 21 and 31 have the same destroy characteristic. When the first subsidiary step-up voltage VB1 generated by the first subsidiary AF power supply step-up circuit 27 is lower than –(VCUT–VA), the voltage difference between the first and the second electrodes A and B of the first anti-fuse element 21 becomes the programmable voltage VCUT and the first anti-fuse element 21 is destroyed. When the second subsidiary step-up voltage VB2 generated by the second subsidiary AF power supply step-up circuit 37 is lower than –(VCUT–VA), the voltage difference between the first and the second electrodes A and B of the second anti-fuse element 31 becomes the programmable voltage VCUT and the second anti-fuse element 31 is destroyed.

It will be assumed for the first and the second programming circuits 120 and 130 that the power supply voltage VDD in a case where the first and the second anti-fuse elements 21 and 31 are destroyed are equal to VDDB1 and VDDB2, respectively. In this event, the first and the second subsidiary step-up voltages VB1 and VB2 are represented by:

$VB1=-(BB1*VDDB1)$, and $VB2=-(BB2*VDDB2)$, where the power supply voltage VDDB1 is lower than the power supply voltage VDDB1, namely, VDDB1<VDDB2. That is, the first and the second anti-fuse elements 21 and 31 have different anti-fuse programming threshold power supply voltages required to destroy the anti-fuse element. Accordingly, the first AF programming circuit 120 has a first anti-fuse programming threshold power supply voltage of VDDB1 while the second AF programming circuit 130 has a second anti-fuse programming threshold power supply voltage of VDDB2.

It will be assumed that the external voltage is represented by VDDE, and the first and the second programming selection signals 23 and 33 erroneously become the logic "H" level to select the first and the second AF programming circuits 120 and 130, where the external voltage VDDE satisfies an equation as follows:

VDDB1<VDDE<VDDB2.

Under the circumstances, the first anti-fuse element 21 is destroyed but the second anti-fuse element 31 is not destroyed.

The semiconductor memory device comprises the first and the second AF programming circuits 120 and 130. As the programming voltage, the same primary step-up voltage VA is supplied to the high potential electrodes A of the first and the anti-fuse elements 21 and 31. The low potential electrodes B of the first and the second anti-fuse elements 21 and 31 are supplied with the first and the second subsidiary step-up voltages VB1 and BV2 from the first and the second subsidiary AF power supply step-up circuits 27 and 37 having the first and the second subsidiary step-up coefficients BB1 and BB2, respectively, which are different from each other. Inasmuch as the first subsidiary step-up coefficient BB1 is different from the second subsidiary step-up coefficient BB2, in a case where the supplied power supply voltage (the external voltage) VDDE is higher than the first anti-fuse programming threshold power supply voltage VDDB1 and is lower than the second anti-fuse programming threshold power supply voltage VDDB2, namely, VDDB1<VDDE<VDDB2, when the first and the second programming selection signals 23 and 33 erroneously become the logic "H" level, the first AF programming circuit 120 can destructively program the first anti-fuse element 21 while the second AF programming circuit 130 cannot destructively program the second anti-fuse element 31.

In the second embodiment of this invention, the first AF programming circuit 120 having the first anti-fuse programming threshold power supply voltage VDDB1 is used in the module test T3 while the second AF programming circuit 130 having the second anti-fuse programming threshold power supply voltage VDDB2 is used in the wafer test T1 or the packaging test T2 in a state of the semiconductor memory device alone. In the similar manner as described in the semiconductor memory device in conjunction with FIGS. 1A and 1B, according to the second embodiment of this invention, it is provided with the semiconductor memory device having the anti-fuse elements with a high programmable efficiency and a high relief efficiency.

In addition, the semiconductor memory device according to this invention may comprise first and second programming circuits comprising a combination of AF power supply step-up circuits having different step-up coefficients at the side of the first and the second electrodes A and B by mixing the first embodiment with the second embodiment.

Figure 5A:
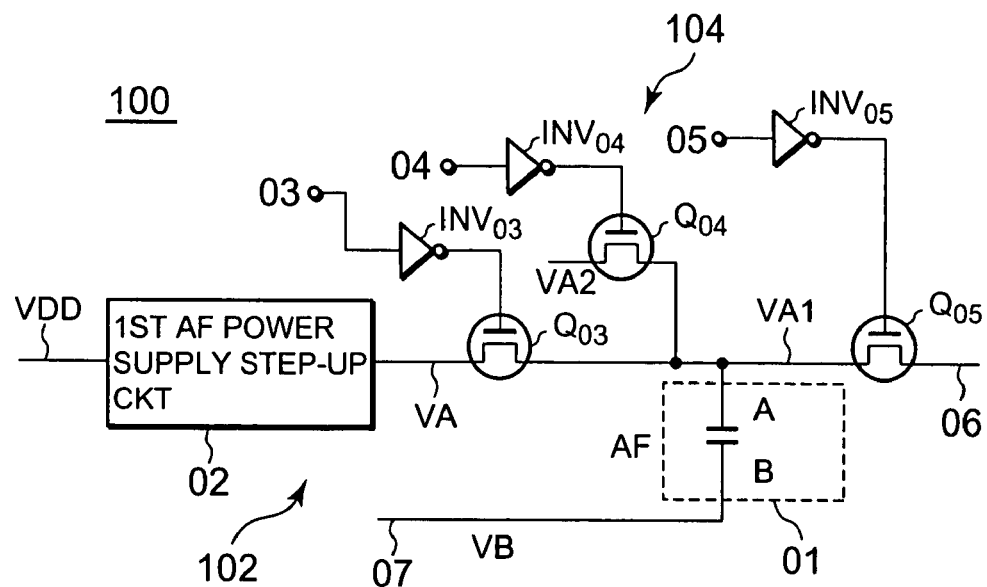
FIGS. 5A and 5B are circuit diagrams of first and second AF programming circuits for use in a semiconductor memory device according to a third embodiment of this invention.
Figure 5B:
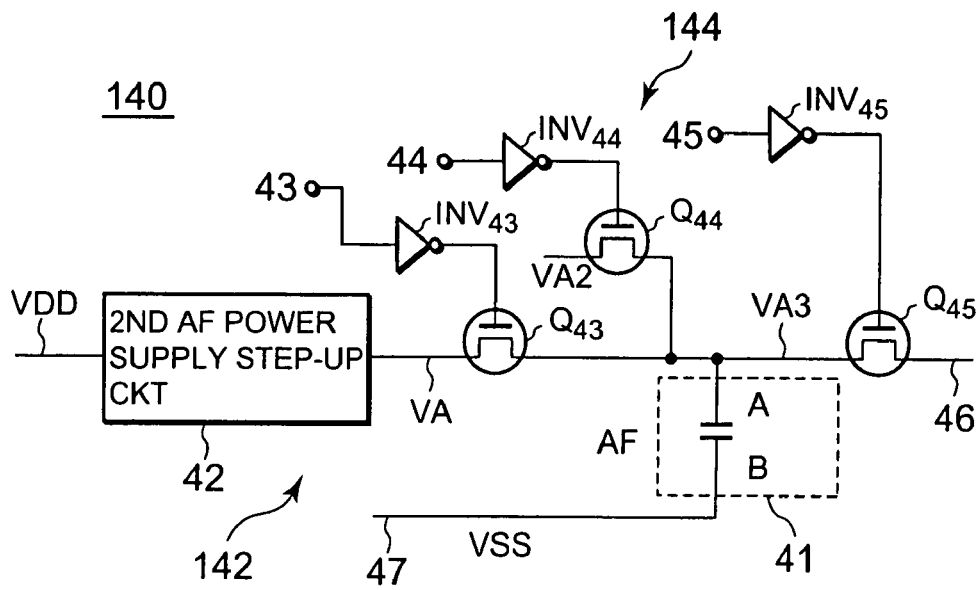
Figure 6:
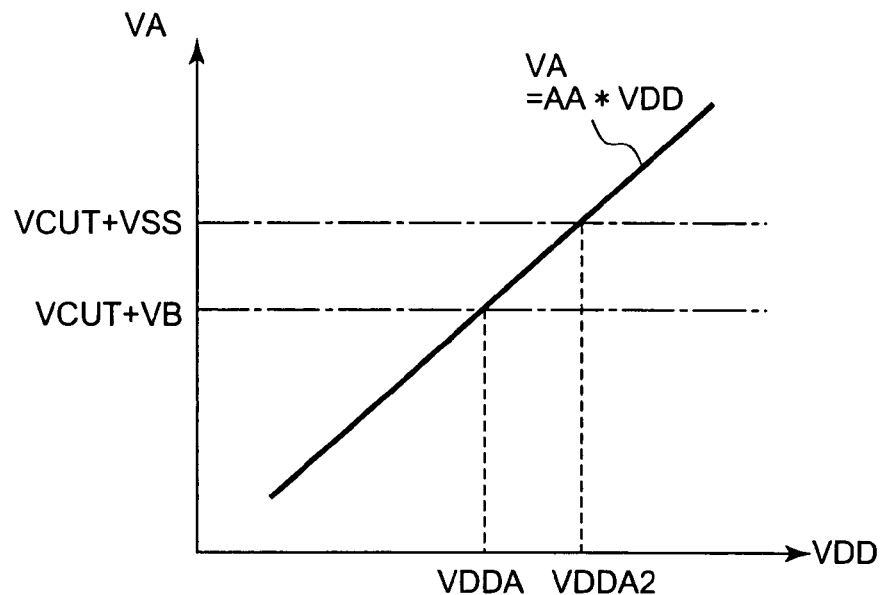
FIG. 6 is a view showing a relationship between a power supply voltage circuit and a step-up voltage in the first and the second AF programming circuits illustrated in FIGS. 5A and 5B.

Referring to FIGS. 5A, 5B, and 6, the description will proceed to semiconductor memory device having anti-fuse elements according to a third embodiment of this invention. The illustrated semiconductor memory device is an example where a potential generated in the semiconductor memory device is used in common.

FIGS. 5A and 5B show first and second AF programming circuits 100 and 140, respectively. The first AF programming circuit 100 illustrated in FIG. 5A is an AF programming circuit for the first anti-fuse element 01 wherein the step-up voltage VA is applied to the high potential electrode A and a first predetermined voltage VB is applied to the low potential electrode B. The second AF programming circuit 140 illustrated in FIG. 5B is an AF programming circuit for a second anti-fuse element 41 wherein the step-up voltage VA is applied to the high potential electrode A and a second predetermined voltage VSS is applied to the low potential electrode B. FIG. 6 is a view showing a relationship between the supplied power supply voltage and the step-up voltage in the first and the second AF programming circuits 100 and 140 illustrated in FIGS. 5A and 5B.

As shown in FIG. 5A, the first AF programming circuit 100 is similar in structure to the first AF programming circuit 100 illustrated in FIG. 1A. Therefore, similar components and similar signals are depicted at the same reference symbols and the description thereof is omitted.

As shown in FIG. 5B, the second AF programming circuit 140 comprises a second anti-fuse (AF) element 41, a second programming voltage supplying portion 142 for supplying a second programming voltage to the second anti-fuse element 41, and a second control circuit 144 which will later be described. The second programming voltage supplying portion 142 comprises a second AF power supply step-up circuit 42 and a second supply line 47 for supplying the second predetermined voltage VSS.

The second anti-fuse element 41 is an anti-fuse element having first and second electrodes A and B. The second anti-fuse element 41 is the anti-fuse element used in a process which is different from that of the first anti-fuse element 01. However, the first and the second anti-fuse elements 01 and 41 are similar in structure and have the same destructive programming characteristic.

The second AF power supply step-up circuit 42 has characteristic similar to that of the first AF power supply step-up circuit 02. The second AF power supply step-up circuit 42 produces the step-up voltage VA. Accordingly, the semiconductor memory device comprises only one AF power supply step-up circuit by providing commonality of the first and the second AF power supply step-up circuit 02 and 42.

The first electrode A of the second anti-fuse element 41 is supplied with a voltage VA3 while the second electrode B of the second anti-fuse element 41 is supplied with the second predetermined voltage VSS. The second predetermined voltage VSS is higher than the first predetermined voltage VB in the first AF programming circuit 100, namely, VSS>VB. The second predetermined voltage VSS may be, for example, a potential used in the semiconductor memory device such as a grand potential, a substrate potential, or the like.

The second control circuit 144 comprises first through third inverter circuits $INV_{43}$, $INV_{44}$, and $INV_{45}$ and first through third transistors $Q_{43}$, $Q_{44}$, and $Q_{45}$. The second control circuit 144 is supplied with a second programming selection signal 43, a second preset control signal 44, and a second decision signal 45. The second programming selection signal 43 is supplied to a control terminal of the first transistor $Q_{43}$ through the first inverter circuit $INV_{43}$. The second preset control signal 44 is supplied to a control terminal of the second transistor $Q_{44}$ through the second inverter circuit $INV_{44}$. The second decision signal 45 is supplied to a control terminal of the third transistor $Q_{45}$ through the third inverter circuit $INV_{45}$.

The first transistor $Q_{43}$ has an input terminal supplied with the step-up voltage VA and an output terminal connected to the first electrode A of the second anti-fuse element 41. The second transistor $Q_{44}$ has an input terminal supplied with the preset voltage VA2 and an output terminal connected to the first electrode A of the second anti-fuse element 41. The third transistor $Q_{45}$ has an input terminal connected to the first electrode A of the second anti-fuse element 41 and an output terminal connected to a second anti-fuse decision node 46.

The second programming selection signal 43 is a selection signal for destructively programming the second anti-fuse element 41. The second programming selection signal 43 is generated on the basis of a supplied power supply voltage value, a command, and an address. The second programming selection signal 43 is for selecting the second programming circuit 140 and the second anti-fuse element 41 provided therein. On programming, the second programming selection signal 43 becomes a logic "H" level. When the second programming selection signal 43 becomes the logic "H" level, the first transistor $Q_{43}$ is turned on to transfer the step-up voltage VA generated by the second AF power supply step-up circuit 42 to the first electrode A of the second anti-fuse element 41 as the voltage VA3. The second preset control signal 44 is a control signal for presetting the first electrode A of the second anti-fuse element 41. On programming and on anti-fuse decision, the second preset control signal 44 becomes a logic "H" level in a one-shot fashion to preset the first electrode A of the second anti-fuse element 41 to the preset voltage VA2. The second decision signal 45 is a decision control signal for transferring a potential state of the first electrode A of the second anti-fuse element 41 to the second anti-fuse decision node 46. On anti-fuse decision, the second decision signal 45 becomes a logic "H" level. Otherwise, the second decision signal 45 takes a logic "L" level.

Referring to FIG. 5B, description will be made as regards operation of the second AF programming circuits 140. It will be assumed that the second AF programming circuit 140 is put into a standby state. In this event, the second AF power supply step-up circuit 42 generates the step-up voltage VA. In addition, all of the second programming selection signal 43, the second preset control signal 44, and the second decision signal 45 take the logic "L" level and all of the first through the third transistors $Q_{43}$, $Q_{44}$, and $Q_{45}$ are turned off. When the programming is carried out to the second anti-fuse element 41, the second preset control signal 44 is changed to the logic "H" level in the one-shot fashion. Under the control, the voltage VA3 of the first electrode A of the second anti-fuse element 41 is preset into the preset voltage VA2. Subsequently, the second programming selection signal 43 is put into the logic "H" level to select the second anti-fuse element 41 to be programmed.

Inasmuch as the first electrodes A of the second anti-fuse element 41 is supplied with the step-up voltage VA, the voltage VA3 of the first electrode A of the second anti-fuse element 41 becomes the step-up voltage VA, namely VA3=VA. In the second anti-fuse element 41, a voltage difference (VA−VSS) occurs between the first electrode A and the second electrode B. If the voltage difference (VA−VSS) is higher than the programmable voltage VCUT of the second anti-fuse element 41, the second anti-fuse element 41 is destroyed and programmed. Thereafter, the second programming selection signal 43 is turned back to the logic "L" level.

Next, decision operation of the second anti-fuse element 41 will be described. The second preset control signal 44 is first preset into the logic "H" level in the one-shot fashion. Under the control, the voltage VA3 of the first electrode A of the second anti-fuse element 41 is preset into the preset voltage VA2, namely, VA3=VA2. Subsequently, the second decision signal 45 is changed to the logic "H" level to force the third transistor $Q_{45}$ into conduction and the potential state of the first electrode A of the second anti-fuse element 41 is read out to the second anti-fuse decision node 46. It will be assumed that the second anti-fuse element 41 is destructively programmed. In this event, the voltage VA3 of the first electrode A of the second anti-fuse element 41 is changed from the preset voltage VA2 to the second predetermined voltage VSS of the second electrode B of the second anti-fuse element 41. It will be assumed that the second anti-fuse element 41 is not destructively programmed. In this event, the voltage VA3 of the first electrode A of the second anti-fuse element 41 holds the preset voltage VA2. After the decision has completed, the second decision signal 45 is turned back to the logic "L" level.

FIG. 6 is a view showing dependence of each voltage used in description of FIGS. 5A and 5B related to the power supply voltage VDD. In VDD dependence of the step-up voltage VA, both the first and the second AF power supply step-up circuits 02 and 42 have the step-up coefficient AA in the manner which is described above. It will be assumed that the power supply voltage supplied to the first and the second AF power supply step-up circuits 02 and 42 are equal to VDD. In this event, the step-up voltage VA is represented by:

$$VA=AA*VDD.$$

It will be assumed that the programmable voltage for programming the anti-fuse element is represented by VCUT and the first and the second anti-fuse elements 01 and 41 have the same destroy programming characteristic. In this event, when the voltage VA1 of the first electrode A of the first anti-fuse element 01 rises up to (VCUT+VB), the first anti-fuse element 01 is destroyed in the first AF programming circuit 100 illustrated in FIG. 5A. When the voltage VA3 of the first electrode A of the second anti-fuse element 41 rises up to (VCUT+VSS), the second anti-fuse element 41 is destroyed in the second AF programming circuit 140 illustrated in FIG. 5B. It will be assumed that the power supply voltage VDD where the first and the second anti-fuse elements 01 and 41 are destroyed are represented by VDDA and VDDA2 which are called first and second anti-fuse programming threshold power supply voltages, respectively. As shown in FIG. 6, the first anti-fuse programming threshold power supply voltage VDDA is lower than the second anti-fuse programming threshold power supply voltage VDDA2, namely, VDDA<VDDA2. That is, the first and the second anti-fuse elements 01 and 41 have the first and the second anti-fuse programming threshold power supply voltages VDDA and VDDA2 which are different from each other.

It will be assumed that the external voltage (the power supply voltage) VDD is represented by VDDE, and the first and the second programming selection signals 03 and 43 erroneously become the logic "H" level to select the first and the second AF programming circuits 100 and 140, where the external voltage VDDE satisfies an equation as follows:

VDDA<VDDE<VDDA2.

In this event, the first anti-fuse element 01 is destroyed while the second anti-fuse element 41 is not destroyed.

In the manner described above, when the supplied power supply voltage VDDE is higher than the first anti-fuse programming threshold power supply voltage VDDA and is lower than the second anti-fuse programming threshold power supply voltage VDDA2, namely, VDDA<VDDE<VDDA2, the first AF programming circuit 100 can destructively program the first anti-fuse element 01 while the second AF programming circuit 140 cannot destructively program the second anti-fuse element 41.

The semiconductor memory device according to the third embodiment of this invention comprises the first and the second AF programming circuits 100 and 140. In the same semiconductor memory device, the first and the second AF programming circuits 100 and 140 have the first and the second anti-fuse programming threshold power supply voltages VDDA and VDDA2 which are different from each other. That is, the first anti-fuse programming threshold power supply voltage VDDA is lower than the second anti-fuse programming threshold power supply voltage VDDA2 as shown in FIG. 6. The first AF programming circuit 100 having the first anti-fuse programming threshold power supply voltage VDDA is used in the module test T3 of FIG. 9. On the other hand, the second AF programming circuit 140 having the second anti-fuse programming threshold power supply voltage VDDA2 is used in the wafer test T1 or the packaging test T2 of FIG. 9.

According to the third embodiment of this invention, the semiconductor memory device comprises a plurality of AF programming circuits having different anti-fuse programming threshold power supply voltages. In a process where a large majority of programming are performed in the semiconductor memory device alone, the AF programming circuit having a high anti-fuse programming threshold power supply voltage is used. On the other hand, in a process (e.g. the module test T3 of FIG. 9) after other semiconductor devices having low withstand voltages for the power supply voltage are mounted, the AF programming circuit having a low anti-fuse programming threshold power supply voltage is used. Inasmuch as the semiconductor memory device comprises a plurality of AF programming circuits having different anti-fuse programming threshold power supply voltages, it is possible to obtain the semiconductor memory device having anti-fuse elements with a high programming efficiency and a high relief efficiency.

Figure 8:
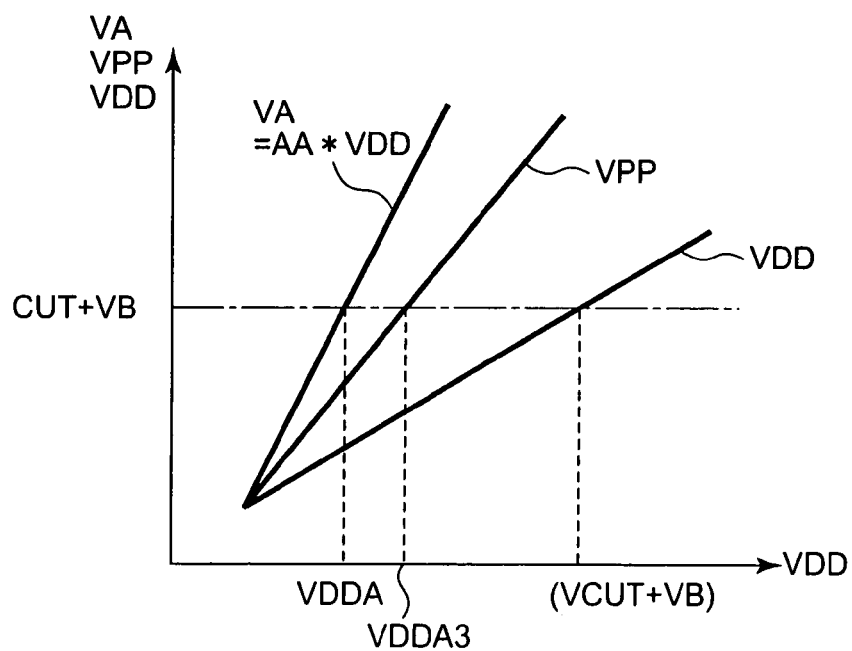
FIG. 8 is a view showing a relationship between a power supply voltage circuit and a step-up voltage in the first and the second AF programming circuits illustrated in FIGS. 7A and 7B.
Figure 7A:
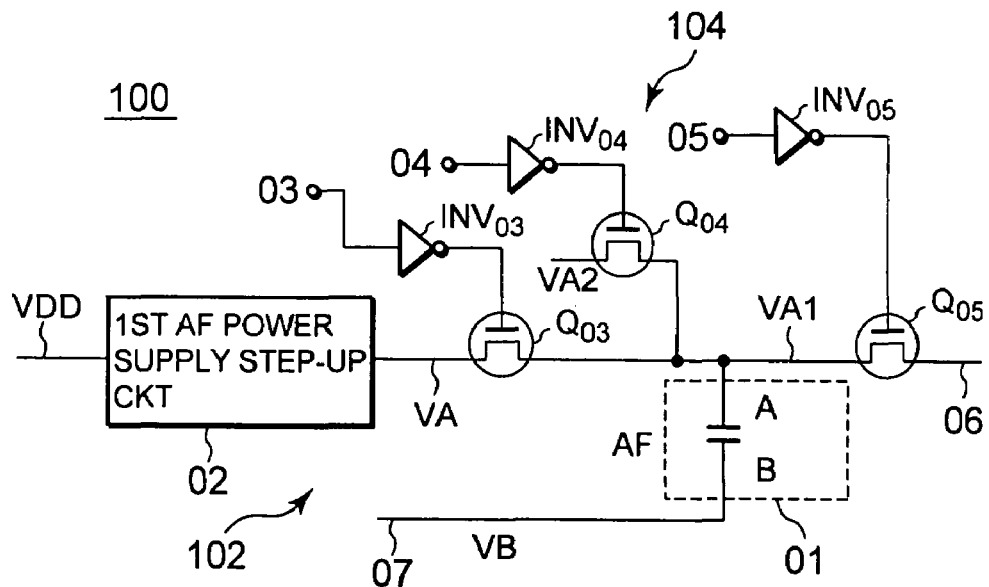
FIGS. 7A and 7B are circuit diagrams of first and second AF programming circuits for use in a semiconductor memory device according to a forth embodiment of this invention.
Figure 7B:
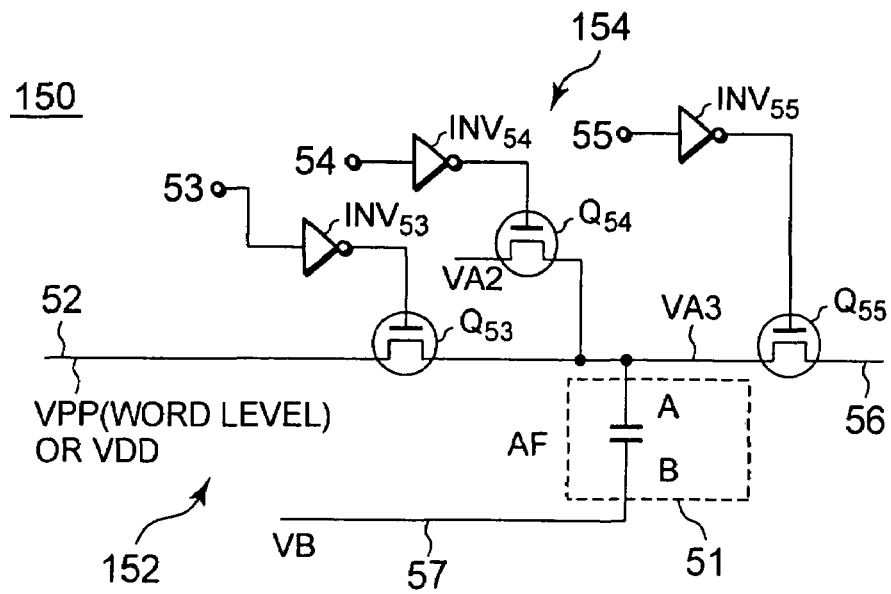

Referring to FIGS. 7A, 7B, and 8, the description will proceed to semiconductor memory device having anti-fuse elements according to a fourth embodiment of this invention. The illustrated semiconductor memory device is another example where a potential generated in the semiconductor memory device is used in common.

FIGS. 7A and 7B show first and second AF programming circuits 100 and 150, respectively. The first AF programming circuit 100 illustrated in FIG. 7A is an AF programming circuit for the first anti-fuse element 01 wherein the step-up voltage VA is applied to the high potential electrode A of the first anti-fuse element 01 and the predetermined voltage VB is applied to the low potential electrode B of the first anti-fuse element 01. The second AF programming circuit 150 illustrated in FIG. 7B is an AF programming circuit for a second anti-fuse element 51 wherein another step-up voltage VPP or the power supply voltage VDD is applied to the high potential electrode A of the second anti-fuse element 51 and the predetermined voltage VB is applied to the low potential electrode B of the second anti-fuse element 51. FIG. 8 is a view showing a relationship between the supplied power supply voltage and the step-up voltage in the first and the second AF programming circuits 100 and 150 illustrated in FIGS. 7A and 7B.

As shown in FIG. 7A, the first AF programming circuit 100 is similar in structure to the first AF programming circuit 100 illustrated in FIG. 1A. Therefore, similar components and similar signals are depicted at the same reference symbols and the description thereof is omitted.

As shown in FIG. 7B, the second AF programming circuit 150 comprises a second anti-fuse (AF) element 51, a second programming voltage supplying portion 152 for supplying a second programming voltage to the second anti-fuse element 51, and a second control circuit 154 which will later be described. The second programming voltage supplying portion 152 comprises a second primary supply line for supplying the step-up voltage VPP or the power supply voltage VDD and a second subsidiary supply line for supplying the predetermined voltage VB.

The second anti-fuse element 51 is an anti-fuse element having first and second electrodes A and B. The second anti-fuse element 51 is the anti-fuse element used in a process which is different from that of the first anti-fuse element 01. However, the first and the second anti-fuse elements 01 and 51 are similar in structure and have the same destructive programming characteristic.

The step-up voltage VPP is a voltage obtained by stepping up the power supply voltage VDD in order to activating, for example, a word line. The first electrode A of the second anti-fuse element 51 is supplied with a voltage VA3 while the second electrode B of the second anti-fuse element 51 is supplied with the predetermined voltage VB.

The second control circuit 154 comprises first through third inverter circuits $INV_{53}$, $INV_{54}$, and $INV_{55}$ and first through third transistors $Q_{53}$, $Q_{54}$, and $Q_{55}$. The second control circuit 154 is supplied with a second programming selection signal 53, a second preset control signal 54, and a second decision signal 55. The second programming selection signal 53 is supplied to a control terminal of the first transistor $Q_{53}$ through the first inverter circuit $INV_{53}$. The second preset control signal 54 is supplied to a control terminal of the second transistor $Q_{54}$ through the second inverter circuit $INV_{54}$. The second decision signal 55 is supplied to a control terminal of the third transistor $Q_{55}$ through the third inverter circuit $INV_{55}$.

The first transistor $Q_{53}$ has an input terminal supplied with the step-up voltage VPP or the power supply voltage VDD and an output terminal connected to the first electrode A of the second anti-fuse element 51. The second transistor $Q_{54}$ has an input terminal supplied with the preset voltage VA2 and an output terminal connected to the first electrode A of the second anti-fuse element 51. The third transistor $Q_{55}$ has an input terminal connected to the first electrode A of the second anti-fuse element 51 and an output terminal connected to a second anti-fuse decision node 56.

The second programming selection signal 53 is a selection signal for destructively programming the second anti-fuse element 51. The second programming selection signal 53 is generated on the basis of a supplied power supply voltage value, a command, and an address. The second programming selection signal 53 is for selecting the second programming circuit 150 and the second anti-fuse element 51 provided therein. On programming, the second programming selection signal 53 becomes a logic "H" level. When the second programming selection signal 53 becomes the logic "H" level, the first transistor $Q_{53}$ is turned on to transfer the step-up voltage VPP or the power supply voltage VDD to the first electrode A of the second anti-fuse element 51 as the voltage VA3. The second preset control signal 54 is a control signal for presetting the first electrode A of the second anti-fuse element 51. On programming and on anti-fuse decision, the second preset control signal 54 becomes a logic "H" level in a one-shot fashion to preset the first electrode A of the second anti-fuse element 51 to the preset voltage VA2. The second decision signal 55 is a decision control signal for transferring a potential state of the first electrode A of the second anti-fuse element 51 to the second anti-fuse decision node 56. On anti-fuse decision, the second decision signal 55 becomes a logic "H" level. Otherwise, the second decision signal 55 takes a logic "L" level.

Referring to FIG. 7B, description will be made as regards operation of the second AF programming circuits 150. It will be assumed that the second AF programming circuit 150 is put into a standby state. In this event, all of the second programming selection signal 53, the second preset control signal 54, and the second decision signal 55 take the logic "L" level and all of the first through the third transistors Q.sub.53, Q.sub.54, and Q.sub.55 are turned off. When the programming is carried out to the second anti-fuse element 51, the second preset control signal 54 is changed to the logic "H" level in the one-shot fashion. Under the control, the voltage VA3 of the first electrode A of the second anti-fuse element 51 is preset into the preset voltage VA2. Subsequently, the second programming selection signal 53 is put into the logic "H" level to select the second anti-fuse element 51 to be programmed.

Inasmuch as the first electrodes A of the selected second anti-fuse element 51 is supplied with the step-up voltage VPP or the power supply voltage VDD, the voltage VA3 of the first electrode A of the second anti-fuse element 41 becomes the step-up voltage VPP or the power supply voltage VDD, namely VA3=VPP (or VDD). In the second anti-fuse element 51, a voltage difference (VPP−VB) or (VDD−VB) occurs between the first electrode A and the second electrode B. If the voltage difference (VPP−VB) or (VDD−VB) is higher than the programmable voltage VCUT of the second anti-fuse element 51, the second anti-fuse element 51 is destroyed and programmed. Thereafter, the second programming selection signal 53 is turned back to the logic "L" level.

Next, decision operation of the second anti-fuse element 51 will be described. The second preset control signal 54 is first preset into the logic "H" level in the one-shot fashion. Under the control, the voltage VA3 of the first electrode A of the second anti-fuse element 51 is preset into the preset voltage VA2, namely, VA3=VA2. Subsequently, the second decision signal 55 is changed to the logic "H" level to force the third transistor $Q_{55}$ into conduction and the potential state of the first electrode A of the second anti-fuse element 51 is read out to the second anti-fuse decision node 56. It will be assumed that the second anti-fuse element 51 is destructively programmed. In this event, the voltage VA3 of the first electrode A of the second anti-fuse element 51 is changed from the preset voltage VA2 to the predetermined voltage VB of the second electrode B of the second anti-fuse element 51. It will be assumed that the second anti-fuse element 51 is not destructively programmed. In this event, the voltage VA3 of the first electrode A of the second anti-fuse element 51 holds the preset voltage VA2. After the decision has completed, the second decision signal 55 is turned back to the logic "L" level.

FIG. 8 is a view showing dependence of each voltage used in description of FIGS. 7A and 7B related to the power supply voltage VDD.

It will be assumed that the programmable voltage for programming the anti-fuse element is represented by VCUT and the first and the second anti-fuse elements 01 and 51 have the same destruction programming characteristic. In this event, when the voltages VA1 and VA3 of the first electrode A of the first and the second anti-fuse elements 01 and 51 rise up to (VCUT+VB), the first and the second anti-fuse elements 01 and 51 are destroyed in the first and the second AF programming circuits 100 and 150 illustrated in FIGS. 7A and 7B. It will be assumed that the power supply voltage VDD where the first anti-fuse element 01 is destroyed is represented by VDDA which is called a first anti-fuse programming threshold power supply voltages and the power supply voltage VDD where the second anti-fuse element 51 is destroyed is represented by VDDA3 or (VCUT+VB) which is called a and second anti-fuse programming threshold power supply voltage. As shown in FIG. 8, the first anti-fuse programming threshold power supply voltage VDDA is lower than the second anti-fuse programming threshold power supply voltage VDDA3 or (VCUT+VB), namely, VDDA<VDDA3< (VCUT+VB). That is, the first and the second anti-fuse elements 01 and 51 have the first and the second anti-fuse programming threshold power supply voltages VDDA and VDDA3 or (VCUT+VB) which are different from each other.

It will be assumed that the first electrode A of the second anti-fuse element 51 has a potential equal to the step-up voltage VPP, the external voltage (the power supply voltage) is represented by VDDE, and the first and the second programming selection signals 03 and 53 erroneously become the logic "H" level to select the first and the second AF programming circuits 100 and 150, where the external voltage VDDE satisfies an equation as follows:

$$VDDA<VDDE<VDDA3.$$

In this event, the first anti-fuse element 01 is destructively programmed while the second anti-fuse element 51 is not destructively programmed.

It will be assumed that the first electrode A of the second anti-fuse element 51 has a potential equal to the power supply voltage VDD, the external voltage is represented by VDDE, and the first and the second programming selection signals 03 and 53 erroneously become the logic "H" level to select the first and the second AF programming circuits 100 and 150, where the external voltage VDDE satisfies an equation as follows:

$$VDDA<VDDE<(VCUT+VB).$$

In this event, the first anti-fuse element 01 is destructively programmed while the second anti-fuse element 51 is not destructively programmed.

In the manner described above, when the supplied power supply voltage VDDE is higher than the first anti-fuse programming threshold power supply voltage VDDA and is lower than the second anti-fuse programming threshold power supply voltage VDDA3 or (VCUT+VB), namely, VDDA<VDDE<VDDA3 or (VCUT+VB), the first AF programming circuit 100 can destructively program the first anti-fuse element 01 while the second AF programming circuit 150 cannot destructively program the second anti-fuse element 51.

The semiconductor memory device according to the forth embodiment of this invention comprises the first and the second AF programming circuits 100 and 150. In the same semiconductor memory device, the first and the second AF programming circuits 100 and 150 have the first and the second anti-fuse programming threshold power supply voltages VDDA and VDDA3 or (VCUT+VB) which are different from each other. That is, the first anti-fuse programming threshold power supply voltage VDDA is lower than the second anti-fuse programming threshold power supply voltage VDDA3 or (VCUT+VB) as shown in FIG. 8. The first AF programming circuit 100 having the first anti-fuse programming threshold power supply voltage VDDA is used in the module test T3 of FIG. 9. On the other hand, the second AF programming circuit 150 having the second anti-fuse programming threshold power supply voltage VDDA3 or (VCUT+VB) is used in the wafer test T1 or the packaging test T2 of FIG. 9.

According to the fourth embodiment of this invention, the semiconductor memory device comprises a plurality of AF programming circuits having different anti-fuse programming threshold power supply voltages. In a process where a large majority of programming are performed in the semiconductor memory device alone, the AF programming circuit having a high anti-fuse programming threshold power supply voltage is used. On the other hand, in a process (e.g. the module test T3 of FIG. 9) after other semiconductor devices having low withstand voltages for the power supply voltage are mounted, the AF programming circuit having a low anti-fuse programming threshold power supply voltage is used. Inasmuch as the semiconductor memory device comprises a plurality of AF programming circuits having different anti-fuse programming threshold power supply voltages, it is possible to obtain the semiconductor memory device having anti-fuse elements with a high programming efficiency and a high relief efficiency.

While this invention has thus far been described in conjunction with a few embodiments thereof, it will readily be possible for those skilled in the art to put this invention into practice in various other manners. For example, although anti-fuse elements are used as nonvolatile memory elements in the above-mentioned embodiments, other nonvolatile memory elements such as fuse elements may be used. Although the semiconductor memory device comprises the first and the second AF programming circuits having first and second anti-fuse programming threshold power supply voltages which are different from each other in the above-mentioned embodiments, a semiconductor memory device generally may comprise first through N-th memory element programming circuits having first and N-th memory element programming threshold power supply voltages which are different from one another, where N represents a positive integer which is not less than two.

What is claimed is:

1. A semiconductor device comprising:
   first and second nonvolatile memory elements, each of which changes information stored therein in response to a programming voltage equal to or greater than a predetermined level;
   a first memory element programming circuit coupled to the first nonvolatile memory element to program the first nonvolatile memory element, the first memory element programming circuit supplying the first nonvolatile memory element with a first programming voltage that is equal or greater than the predetermined level when the first memory element programming circuit receives a first supply voltage, and with a second programming voltage that is less than the predetermined level when the first memory element programming circuit receives a second supply voltage that is smaller than the first supply voltage; and
   a second memory element programming circuit coupled to the second nonvolatile memory element to program the second nonvolatile memory element, the second memory element programming circuit supplying the second nonvolatile memory element with a third programming voltage that is equal or greater than the predetermined level when the second memory element programming circuit receives the first supply voltage, and with a fourth programming voltage that is equal to greater than the predetermined level when the second memory element programming circuit receives the second supply voltage.

2. The semiconductor device as claimed in claim 1, wherein said first memory element programming circuit comprises a first programming voltage supplying portion supplying the first programming voltage to said first nonvolatile memory element, said second memory element programming circuit comprising a second programming voltage supplying portion supplying the third programming voltage to said second nonvolatile memory element, each of said first and said second nonvolatile memory elements having first and second electrodes,
wherein said first programming voltage supplying portion comprises:
a first power supply step-up circuit stepping up the first supply voltage to a first step-up voltage, said first power supply step-up circuit having a first step-up coefficient, said first power supply step-up circuit supplying the first step-up voltage to the first electrode of said first nonvolatile memory element; and
a first supply line supplying a predetermined voltage to the second electrode of said first nonvolatile memory element, and
wherein said second programming voltage supplying portion comprises:
a second power supply step-up circuit stepping up the second supply voltage to a second step-up voltage, said second power supply step-up circuit having a second step-up coefficient which is greater than the first step-up coefficient, said second power supply step-up circuit supplying the second step-up voltage to the first electrode of said second nonvolatile memory element; and
a second supply line supplying the predetermined voltage to the second electrode of said second nonvolatile memory element.

3. The semiconductor device as claimed in claim 1, wherein said first memory element programming circuit comprises a first programming voltage supplying portion supplying the first programming voltage to said first nonvolatile memory element, said second memory element programming circuit comprising a second programming voltage supplying portion supplying the third programming voltage to said second nonvolatile memory element, each of said first and said second nonvolatile memory elements having first and second electrodes,
wherein said first programming voltage supplying portion comprises:
a first primary power supply step-up circuit stepping up the first supply voltage to a primary step-up voltage, said first primary power supply step-up circuit having a primary step-up coefficient, said first primary power supply step-up circuit supplying the primary step-up voltage to the first electrode of said first nonvolatile memory element; and
a first subsidiary power supply step-up circuit stepping up the first supply voltage to a first subsidiary step-up voltage, said first subsidiary power supply step-up circuit having a first subsidiary step-up coefficient, said first subsidiary power supply step-up circuit supplying the first subsidiary step-up voltage to the second electrode of said first nonvolatile memory element,
wherein said second programming voltage supplying portion comprises:
a second primary power supply step-up circuit stepping up the second supply voltage to the primary step-up voltage, said second primary power supply step-up circuit having the primary step-up coefficient, said second primary power supply step-up circuit supplying the primary step-up voltage to the first electrode of said second nonvolatile memory element; and
a second subsidiary power supply step-up circuit stepping up the second supply voltage to a second subsidiary step-up voltage, said second subsidiary power supply step-up circuit having a second subsidiary step-up coefficient which is greater than the first subsidiary step-up coefficient, said second subsidiary power supply step-up circuit supplying the second subsidiary step-up voltage to the second electrode of said second nonvolatile memory element.

4. The semiconductor mommy device as claimed in claim 1, wherein said first memory element programming circuit comprises a first programming voltage supplying portion supplying the first programming voltage to said first nonvolatile memory element, said second memory element programming circuit comprising a second programming voltage supplying portion supplying the third programming voltage to said second nonvolatile memory element, each of said first and said second nonvolatile memory elements having first and second electrodes,
wherein said first programming voltage supplying portion comprises:
a first power supply step-up circuit stepping up the first supply voltage to a step-up voltage, said first power supply step-up circuit having a step-up coefficient, said first power supply step-up circuit supplying the step-up voltage to the first electrode of said first nonvolatile memory element; and
a first supply line supplying a first predetermined voltage to the second electrode of said first nonvolatile memory element,
wherein said second programming voltage supplying portion comprises:
a second power supply step-up circuit stepping up the second supply voltage to the step-up voltage, said second power supply step-up circuit having the step-up coefficient, said second power supply step-up circuit supplying the step-up voltage to the first elect-ode of said second nonvolatile memory element; and
a second supply line supplying a second predetermined voltage to the second electrode of said second nonvolatile memory element the second predetermined voltage being less than the step-up voltage.

5. The semiconductor memory device as claimed in claim 1, wherein said first memory element programming circuit comprises a first programming voltage supplying portion supplying the first programming voltage to said first nonvolatile memory element, said second memory element programming circuit comprising a second programming voltage supplying portion supplying the third programming voltage to said second nonvolatile memory element, each of said first and said second nonvolatile memory elements having first and second electrodes,
wherein said first programming voltage supplying portion comprises:
a first primary supply line supplying, as the first supply voltage, a predetermined potential generated in said semiconductor device to the first electrode of said first nonvolatile memory element; and
a first subsidiary supply line supplying a predetermined voltage to the second electrode of said first nonvolatile memory element; and
wherein said second programming voltage supplying portion comprises:
a second power supply step-up circuit stepping up the second supply voltage to a step-up voltage, said first power supply step-up circuit having a step-up coefficient, said first power supply step-up circuit supplying the step-up voltage to the first electrode of said second nonvolatile memory element; and a second supply line supplying the predetermined voltage to the second electrode of said second nonvolatile memory element.

6. The semiconductor device as claimed in claim 5, wherein the predetermined potential comprises a step-up voltage for activating a word line of said semiconductor device.

7. The semiconductor device as claimed in claim 5, wherein the predetermined potential is a power supply voltage.

8. The semiconductor device as claimed in claim 1, wherein said first memory element programming circuit is used in a wafer test and a packaging test when the power supply voltage is high, said second memory element programming circuit being used in a module test and a packaging test when the power supply voltage is low.

9. A semiconductor device comprising:
first and second nonvolatile memory elements, each of which changes information stored therein in response to a programming voltage equal to or greater than a predetermined level;
a first voltage supplying portion that coupled to the first nonvolatile memory element to program the first nonvolatile memory element, the first voltage supplying portion amplifying a first supply voltage to a first programming voltage that is equal or greater than the predetermined level to supply the first nonvolatile memory element with the first programming voltage when the first voltage supplying portion receives the first supply voltage, and amplifying a second supply voltage that is smaller than the first supply voltage to a second programming voltage that is less than the predetermined level to supply the first nonvolatile memory element with the second programming voltage when the first voltage supplying portion receives the second supply voltage; and
a second voltage supplying portion that coupled to the second nonvolatile memory element to program the second nonvolatile memory element, the second voltage supplying portion amplifying the first supply voltage to a third programming voltage that is equal or greater than the predetermined level to supply the second nonvolatile memory element with the third programming voltage when the second voltage supplying portion receives the first supply voltage, and amplifying the second supply voltage to a fourth programming voltage that is equal or greater than the predetermined level to supply the second nonvolatile memory element with the fourth programming voltage when the second voltage supplying portion receives the second supply voltage.

10. The semiconductor device according to claim 9, wherein said first voltage supplying portion comprises a first set-up circuit stepping up the first supply voltage with a first set-up coefficient into a first set-up voltage, said first set-up circuit supplying the first set-up voltage to a first end electrode of said first nonvolatile memory element,
wherein said second voltage supplying portion comprises a second set-up circuit stepping up the second supply voltage with a second set-up coefficient into a second set-up voltage, said second set-up circuit supplying the second set-up voltage to a first end electrode of said second nonvolatile memory element and wherein the first set-up coefficient is less than the second set-up coefficient.

11. The semiconductor device according to claim 10, wherein said first and said second nonvolatile memory elements comprise second end electrodes which are supplied with a common voltage.

12. The semiconductor device according to claim 10, wherein said first voltage supplying portion comprises a third set-up circuit setting up the first supply voltage with a third set-up coefficient into a third set-up voltage which is opposite in polarity with respect to the first set-up voltage, said third set-up circuit supplying the third set-up voltage to a second end electrode of said first nonvolatile memory element,
wherein said second voltage supplying portion comprises a fourth set-up circuit stepping up the second supply voltage with a fourth set-up coefficient into a fourth set-up voltage which is opposite in polarity with respect to the second set-up voltage, said fourth set-up circuit supplying the fourth set-up voltage to a second end electrode of said second nonvolatile memory element, and
wherein the third set-up coefficient is less than the fourth set-up coefficient.

13. The semiconductor device according to claim 9, wherein said first voltage supplying portion comprises a first set-up circuit stepping up the first supply voltage with a first sot-up coefficient into a first set-up voltage, said first set-up circuit supplying the first set-up voltage to a first end electrode of said first nonvolatile memory element,
wherein said second voltage supplying portion comprises a second set-up circuit stepping up the second supply voltage with a second set-up coefficient into a second set-up voltage, said second set-up circuit supplying the second set-up voltage to a first end electrode of said second nonvolatile memory element,
wherein the first set-up coefficient is equal to the second set-up coefficient, and
wherein said first nonvolatile memory element comprises a second end electrode supplied with a voltage which is greater than that supplied with a second end electrode of said second nonvolatile memory element.

14. The semiconductor device according to claim 9, wherein said first and second nonvolatile memory elements comprise first and second anti-fuse elements which are similar in structure to each other.

15. The semiconductor device according to claim 10, wherein at least one of said first and said set-up circuits is shared with a set-up circuit for use in an internal circuit of said semiconductor device.

16. The semiconductor device according to claim 9, wherein said first nonvolatile memory element switches an internal operation and substitutes a defective address substitution in a redundancy circuit, and
wherein said second nonvolatile memory element substitutes a defective address in said redundancy circuit.

17. A semiconductor device comprising:
first and second anti-fuse elements, each of which changes information stored therein from a non-conductive state to a conductive state in response to a break-down voltage equal to or greater than a predetermined level;
a first voltage supplying portion coupled to the first anti-fuse element to program the first anti-fuse element the first voltage supplying portion supplying the first anti-fuse element with a first break-down voltage that is equal or greater than the predetermined level when the first voltage supplying portion receives a first supply voltage, and with a second break-down voltage that is less than the predetermined level when the first voltage supplying portion receives a second supply voltage that is smaller than the first supply voltage; and a second voltage supplying portion coupled to the second anti-fuse element to program the second anti-fuse element, the second voltage supplying portion supplying the second anti-fuse element with a third break-down voltage that is equal or greater than the predetermined level when the second voltage supplying portion receives the fast supply voltage, and with a fourth break-down voltage that is equal to greater than the predetermined level when the second voltage supplying portion receives the second supply voltage.

18. The semiconductor device according to claim 17, wherein said first voltage supplying portion comprises a first set-up circuit stepping up the first supply voltage with a first set-up coefficient into a first set-up voltage, said first set-up circuit supplying the first set-up voltage to a first end electrode of said first anti-fuse element, wherein said second voltage supplying portion comprises a second set-up circuit stepping up the second supply voltage with a second set-up coefficient into a second set-up voltage, said second set-up circuit supplying the second set-up voltage to a first end electrode of said second anti-fuse element, wherein the first set-up coefficient is smaller than the second set-up coefficient.

19. The semiconductor memory device according to claim 18, wherein said first and said second anti-fuse elements has second end electrodes which are supplied with a common voltage.

20. The semiconductor memory device according to claim 18, wherein said first voltage supplying portion comprises a third set-up circuit setting up the first supply voltage with a third set-up coefficient into a third set-up voltage which is opposite in polarity with respect to the first set-up voltage, said third set-up circuit supplying the third set-up voltage to a second end electrode of said first anti-fuse element, wherein said second voltage supplying portion comprises a fourth set-up circuit stepping up the second supply voltage with a fourth set-up coefficient into a fourth set-up voltage which is opposite in polarity with respect to the second set-up voltage, said fourth set-up circuit supplying the fourth set-up voltage to a second end electrode of said second anti-fuse element, wherein the third set-up coefficient is smaller than the fourth set-up coefficient.

21. The semiconductor memory device according to claim 17, wherein said first voltage supplying portion comprises a first set-up circuit stepping up the first supply voltage with a first set-up coefficient into a first set-up voltage, said first set-up circuit supplying the first set-up voltage to a first end electrode of said first anti-fuse element, wherein said second voltage supplying portion comprises a second set-up circuit stepping up the second supply voltage with a second set-up coefficient into a second set-up voltage, said second set-up circuit supplying the second set-up voltage to a first end electrode of said second anti-fuse element, wherein the first set-up coefficient is equal to the second set-up coefficient, wherein said first anti-fuse element has a second end electrode supplied with a voltage which is higher than that supplied with a second end electrode of said second anti-fuse element.

\* \* \* \* \*